US009201098B2

(12) United States Patent
Chang et al.

(10) Patent No.: US 9,201,098 B2
(45) Date of Patent: Dec. 1, 2015

(54) HIGH FREQUENCY PROBE CARD

(71) Applicant: MPI CORPORATION, Chu-Pei, Hsinchu Shien (TW)

(72) Inventors: Chia-Tai Chang, Chu-Pei (TW);
Chin-Yi Tsai, Chu-Pei (TW);
Chiu-Kuei Chen, Chu-Pei (TW);
Chen-Chih Yu, Chu-Pei (TW);
Chien-Chang Lai, Chu-Pei (TW);
Chin-Tien Yang, Chu-Pei (TW);
Hui-Pin Yang, Chu-Pei (TW);
Keng-Shieng Chang, Chu-Pei (TW);
Yun-Ru Huang, Chu-Pei (TW)

(73) Assignee: MPI CORPORATION, Chu-Pei, Hsinchu Shien (TW)

( * ) Notice: Subject to any disclaimer, the term of this patent is extended or adjusted under 35 U.S.C. 154(b) by 254 days.

(21) Appl. No.: 13/941,210

(22) Filed: Jul. 12, 2013

(65) Prior Publication Data

US 2014/0015561 A1 Jan. 16, 2014

(30) Foreign Application Priority Data

Jul. 13, 2012 (TW) .............................. 101213567 U
Jul. 20, 2012 (TW) .............................. 101214087 U
Aug. 28, 2012 (TW) .............................. 101216517 U

(51) Int. Cl.
*G01R 31/00* (2006.01)
*G01R 1/073* (2006.01)
*G01R 1/067* (2006.01)

(52) U.S. Cl.
CPC ........ *G01R 1/07342* (2013.01); *G01R 1/06772* (2013.01)

(58) Field of Classification Search
None
See application file for complete search history.

(56) References Cited

U.S. PATENT DOCUMENTS

| 5,525,911 | A | * | 6/1996 | Marumo | ............ G01R 1/06711 324/750.25 |
|---|---|---|---|---|---|
| 5,959,461 | A | | 9/1999 | Brown et al. | |
| 6,509,751 | B1 | | 1/2003 | Mathieu et al. | |
| 7,595,651 | B2 | * | 9/2009 | Ku | ..................... G01R 1/07342 324/755.07 |
| 7,956,627 | B2 | * | 6/2011 | Kasukabe et al. | ....... 324/750.22 |
| 8,832,933 | B2 | * | 9/2014 | Kuo et al. | ........................ 29/840 |
| 2010/0134130 | A1 | * | 6/2010 | Lou et al. | ...................... 324/760 |

FOREIGN PATENT DOCUMENTS

| CN | 201203517 Y | 3/2009 |
|---|---|---|
| JP | H05-113451 | 5/1993 |
| JP | H05-307049 | 11/1993 |

(Continued)

*Primary Examiner* — Paresh Patel
(74) *Attorney, Agent, or Firm* — Muncy, Geissler, Olds & Lowe, P.C.

(57) ABSTRACT

A high frequency probe card includes at least one substrate having at least one first opening, an interposing plate disposed on the at least one substrate and having at least one second opening corresponding to the at least one first opening, a circuit board disposed on the interposing plate and having a third opening corresponding to the at least one first and second openings, and at least one probe module including at least one ground probe and at least one high frequency signal probe passing through the corresponding substrate, the interposing plate and the third opening and being electrically connected with the circuit board. Each high frequency signal probe includes a signal probe and a first conductor corresponding to the signal probe and being electrically connected with the ground probe. An insulation layer is disposed between the first conductor and the signal probe.

20 Claims, 17 Drawing Sheets

(56) References Cited

FOREIGN PATENT DOCUMENTS

| | | |
|---|---|---|
| JP | H06-181246 | 6/1994 |
| JP | 2534882 | 6/1996 |
| JP | H09-274125 | 10/1997 |
| JP | H11-026521 | 1/1999 |
| JP | 2007-103787 | 4/2007 |
| JP | 2007-311515 | 11/2007 |
| JP | 2008-45950 | 2/2008 |
| JP | 2009-265065 | 11/2009 |
| JP | 2011-112421 | 6/2011 |
| TW | 200829926 | 7/2008 |
| TW | M356906 | 5/2009 |
| TW | I366672 | 6/2012 |
| TW | I375038 | 10/2012 |
| TW | I378245 | 12/2012 |
| TW | I390209 | 3/2013 |
| TW | I408373 | 9/2013 |
| WO | WO 2004/053451 A1 | 6/2004 |
| WO | WO 2007/066622 A1 | 6/2007 |
| WO | WO 2008/059767 A1 | 5/2008 |

\* cited by examiner

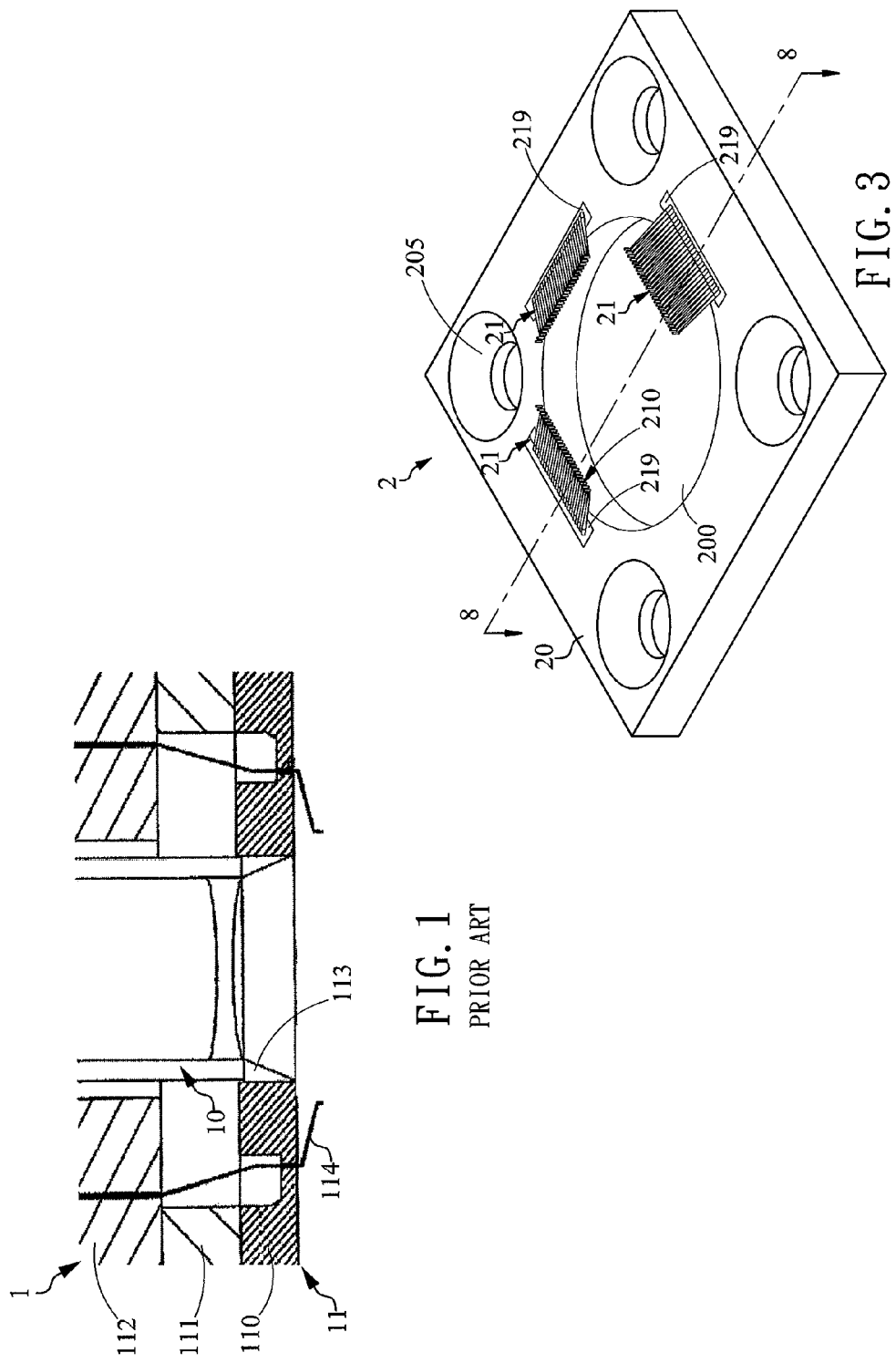

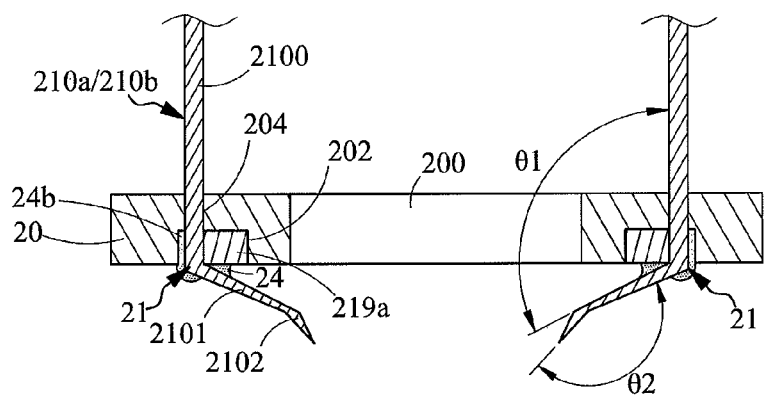
FIG. 8
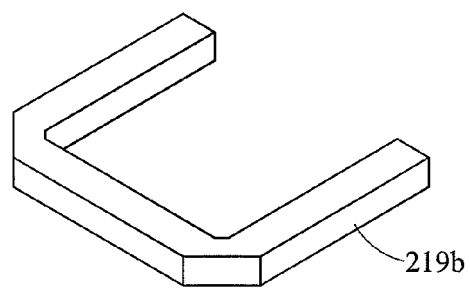          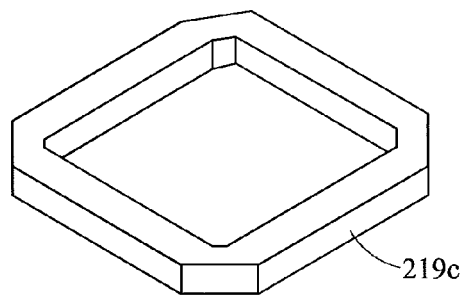
FIG. 9A                FIG. 9B

HIGH FREQUENCY PROBE CARD

CROSS-REFERENCE TO RELATED APPLICATIONS

This application claims priorities from Taiwan Patent Application No. 101213567 filed on Jul. 13, 2012, Taiwan Patent Application No. 101214087 filed on Jul. 20, 2012 and Taiwan Patent Application No. 101216517 filed on Aug. 28, 2012, the entire contents of which are incorporated herein by reference.

BACKGROUND OF THE INVENTION

1. Field of the Invention

The present invention relates to probing apparatus for probing devices under test and more particularly, to a high frequency probe card.

2. Description of the Related Art

In a task of testing semiconductor chip, the tester needs to contact a device under test (DUT), such as a chip, through a probe card, and meanwhile the test result of the DUT can be obtained by conducting signal transmission and electric signal analysis. The aforesaid probe card is generally equipped with a plurality of fine-dimensional probes arranged in a certain pattern such that each probe may be aligned with a specific contact pad of the chip under test. When the probes contact the corresponding contact pads of the DUT respectively, they can positively transmit the test signals from the tester. In the meantime, the purpose of measuring the electric characteristics of the DUT can be achieved by the cooperation of the control and analysis processes of the probe card and the tester.

As the operating condition of electronic components tends to increasingly high speed and high frequency, the electronic components generally have a high standard specification on their electric characteristics, such as component operating condition, operating frequency and signal transmitting characteristic. Under this circumstance, the design of the probe card for electric testing needs to focus on the testing condition, the testing bandwidth and the completeness of the test signal transmission. In order to transmit the high frequency test signals effectively, the probe card selected for fulfilling such purpose must have a certain impedance matching with the tester and the device under test so as to accurately reflect the test result.

FIG. 1 shows an optical inspection device of a prior art disclosed in Taiwan Patent Publication No. 200829926. The optical inspection device, denoted by reference numeral 1, comprises an optical lens 10 and a probe card 11 including a substrate 110, an interposing plate 111 and a circuit board 112. The substrate 110 is provided with an opening 113 aligned with the openings of the interposing plate 111 and the circuit board 112 respectively for passing the optical signal from the optical lens 10 therethrough. The substrate 110 is arranged with a plurality of probes 114, each of which penetrates through the substrate 110, runs through the opening of the interposing plate 111, and penetrates through the circuit board 112 and is electrically connected with the surface of the circuit board 112. In the design of the aforesaid Taiwan patent application, it is involved with an additional work of processing the circuit board 112 with through holes or openings for the penetration of the probes 114, resulting in an increase of the manufacturing cost and a hard and complicated task in manufacturing.

In light of the above, it is desired to provide a high frequency probe card, which is impedance matching with the tester and the device under test and can be manufactured simply and easily.

SUMMARY OF THE INVENTION

The present invention has been accomplished under the circumstances in view. It is an objective of the present invention to provide a high frequency probe card, which can maintain the impedance of the high frequency test signal, achieve the effect of transmitting the high frequency test signal with high quality, and be applied for testing IC chips.

It is another objective of the present invention to provide a high frequency probe card equipped with a lens adjusting mechanism, which is provided with threads and at least one adjustment notch at a top portion of a lens holder, such that the position of the lens holder carrying a lens therein can be simply adjusted by an adjustment jig.

In an embodiment, a high frequency probe card provided by the present invention comprises at least one substrate, an interposing plate, a circuit board and at least one probe module. The substrate has at least one first opening. The interposing plate is disposed on the at least one substrate and provided with at least one second opening corresponding to the at least one first opening respectively. The circuit board is disposed on the interposing plate and provided with a third opening corresponding to the at least one first opening and the at least one second opening. The at least one probe module is disposed on the at least one substrate and arranged around a periphery of the at least one first opening respectively. The at least one probe module comprises at least one ground probe and at least one high frequency signal probe. The at least one high frequency signal probe penetrates through the at least one substrate and the interposing plate, passes through the third opening, and is electrically connected with the circuit board. Each high frequency signal probe comprises a signal probe and a first conductor. The first conductor is corresponding to the signal probe and electrically connected with the ground probe. An insulation layer is disposed between the signal probe and the first conductor.

In an embodiment of the present invention, each substrate comprises at least one groove in which one probe module is accommodated. Each probe module further comprises a fixing member connected with a corresponding groove. The at least one ground probe and the at least one high frequency signal probe are connected with the fixing member and penetrate through the corresponding groove.

In another embodiment of the present invention, the high frequency probe card further comprises at least one lens adjusting mechanism including a lens holder and a position adjusting structure. The lens holder is coupled in the second opening and provided with an accommodation. The position adjusting structure is configured corresponding to the at least one second opening and the lens holder and formed with the interposing plate and the lens holder for enabling the lens holder to do a position adjusting motion in the at least one second opening.

BRIEF DESCRIPTION OF THE DRAWINGS

The present invention will become more fully understood from the detailed description given herein below and the accompanying drawings which are given by way of illustration only, and thus are not limitative of the present invention, and wherein:

FIG. 1 is a schematic drawing of an optical inspection device of a prior art;

FIG. 3 is a schematic perspective view of a part of the high frequency probe card according to the preferred embodiment of the present invention;

FIG. 8 is a cross-sectional view taken along the line 8-8 of FIG. 3;

FIGS. 9A and 9B are schematic views showing two alternate forms of the fixing members that are integrally connected and formed in a one-piece construction;

DETAILED DESCRIPTION OF EMBODIMENTS

It is to be mentioned that the present invention relates to a high frequency probe card for testing semiconductors or photoelectric devices, wherein the operational principal and basic function of the probe card and the probe are well-known to a person skilled in the art; therefore, the detailed description of the aforesaid operational principal and basic function will not be depicted hereunder for concise illustration purpose. In addition, the accompanying drawings are used to schematically illustrate the structural features of the present invention only; therefore, they are not sketched in accordance with the actual dimension.

Figure 2A:
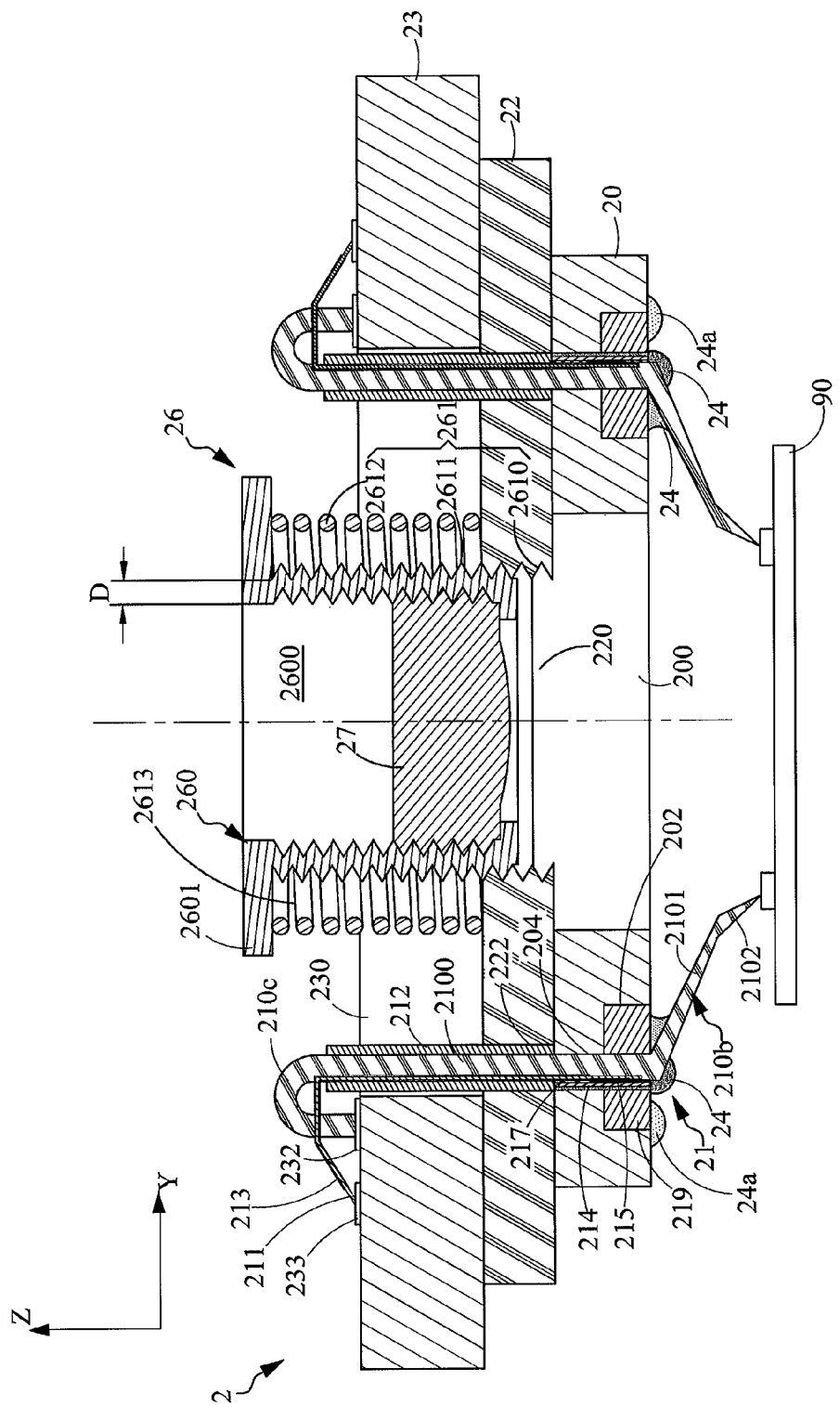
FIG. 2A is a cross-sectional view of a high frequency probe card according to a preferred embodiment of the present invention.
Figure 2B:
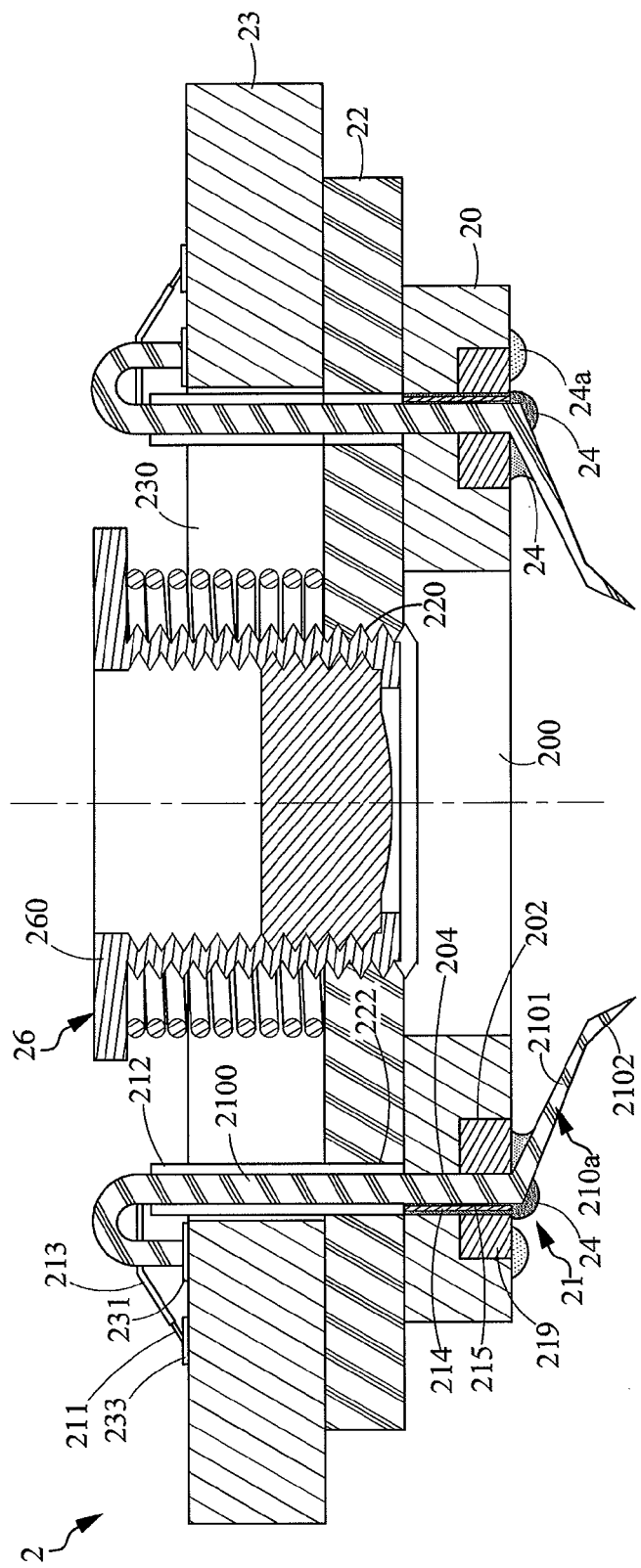
FIG. 2B is another cross-sectional view of the high frequency probe card according to the preferred embodiment of the present invention.
Figure 4A:
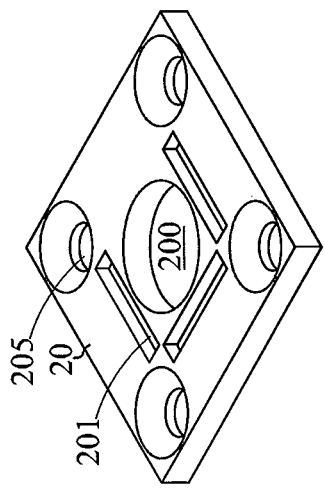
FIGS. 4A and 4B are schematic perspective views showing two alternate forms of the substrate of the high frequency probe card of the present invention.
Figure 4B:
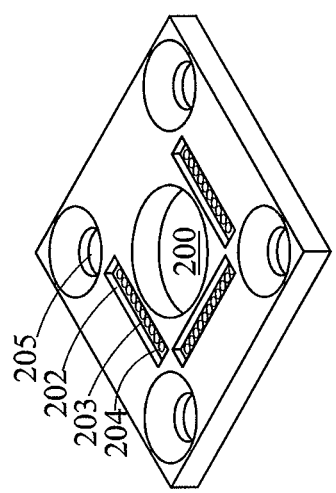

FIG. 2A is a schematic cross-sectional view of a high frequency probe card according to a preferred embodiment of the present invention, in which the signal probes are shown. FIG. 2B is another schematic cross-sectional view of the high frequency probe card of the present invention, in which the ground probes are shown. Referring to FIGS. 2A and 2B, the high frequency probe card 2, provided by an embodiment of the present invention, is composed of a substrate 20, a plurality of probe modules 21, an interposing plate 22 and a circuit board 23. FIG. 3 is a schematic perspective view showing a part of the high frequency probe card 2 of the present invention, in which the probe modules 21 are shown. As shown in FIG. 3, the substrate 20 is provided with a first opening 200, around a periphery of which the probe modules 21 are arranged. Referring to FIGS. 4A and 4B, FIGS. 4A and 4B show two alternate forms of the substrate 20, respectively. As shown in FIG. 4A, the substrate 20 includes a plurality of grooves 201, which are arranged around the periphery of the first opening 200 and penetrate through the body of the substrate 20. These grooves 201 may be arranged, but not limited to, in a U-shaped manner or a rectangle-shaped manner. As shown in FIG. 4A, the grooves 201 are arranged like a U-shaped manner, i.e. the grooves 201 arranged at three sides of the periphery of the first opening 200. Referring to FIG. 4B, the grooves 202 of the substrate 20 in this alternate form do not penetrate the body of the substrate 20 but each have a bottom surface 203 on which a plurality of first through holes 204 penetrating the body of the substrate 20 are provided. It is to be mentioned that the substrate 20 may be made of, but not limited to, engineering plastics, Bakelite or ceramic material. Preferably, the substrate 20 in this embodiment is a ceramic plate. In addition, the substrate 20 shown in FIG. 4A or FIG. 4B is provided with a plurality of countersunk holes 205, the number and position of which can be determined according to the actual dimension and configuration of the substrate 20, not limited to be arranged at the four corners of the substrate 20 as shown in FIGS. 4A and 4B. When fasteners, such as screws, are used to fasten the substrate 20 to the interposing plate 22, the fasteners can be respectively inserted into and sunk within the countersunk holes 205, such that the fasteners will not protrude over the surface of the substrate 20 so as to prevent the chips under test from damage. It will be appreciated that the grooves 201 shown in FIG. 4A or the groves 202 shown in FIG. 4B can be designed to be communicated with each other so as to form a U-shaped manner accordingly. These grooves can be designed according to the actual need.

Figure 5A:
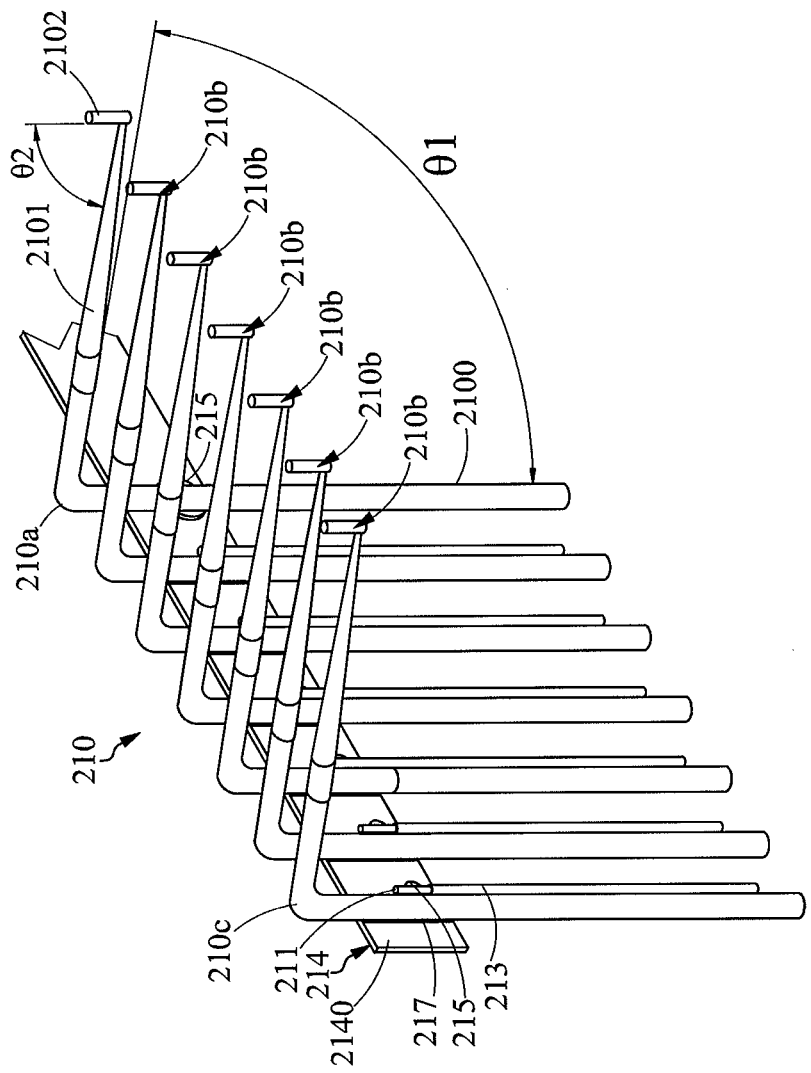
FIGS. 5A to 5E are schematic perspective views showing various alternate forms of a part of the high frequency probe structure of one of the probe modules shown in FIG. 3.

Referring to FIG. 3, in this embodiment, each probe module 21 includes a series of probes 210 and fixing member 219. The components of the series of probes 210 will be detailedly illustrated hereinafter. Referring to FIG. 5A, this figure schematically shows a part of the high frequency probe structure of one series of probes 210 shown in FIG. 3. In this embodiment, the high frequency probe structure of the series of probes 210 includes a ground probe 210a and a plurality of high frequency signal probes 210b each having a signal probe 210c and a first conductor 211. The ground probe 210a and the signal probes 210c each have an extension portion 2100, a suspension arm 2101 and a detecting portion 2102. The suspension arm 2101 is integrally connected with the extension portion 2100 and defines with the extension portion 2100 a first contained angle $\theta_1$. The detecting portion 2102 is integrally connected with the suspension arm 2101 and defines with the suspension arm 2101 a second contained angle $\theta_2$. The degrees of the first and second contained angles $\theta_1$ and $\theta_2$ are not specifically limited. These contained angles can be set at any desired angle based on the actual need of bending. It is to be especially mentioned that the extension portion 2100 of the ground probe 210a can be partially cut off, such that a relatively short part thereof is left for being electrically connected with the first conductor 211.

The first conductor 211 is arranged corresponding in location to the signal probe 210c. An insulation layer 213 is disposed between the signal probe 210c and the first conductor 211 to keep the signal probe 210c away from the first conductor 211 at a predetermined insulation distance, which is equal to the thickness of the insulation layer 213 at minimum. In this embodiment, the first conductor 211 is realized as a conductive lead wire. In addition, the insulation layer 213 is configured to encapsulate the circumference of the first conductor 211; however, the design of the insulation layer is not limited to the one disclosed in this embodiment.

In this embodiment, an end of the first conductor 211 is electrically connected with the ground probe 210a through a second conductor 214 because the ground probe 210a and the signal probes 210c are set in a one-to-many relationship. The second conductor 214 may be, but not limited to, a conductive belt or a lead wire based on the actual need. In this embodiment, the second conductor 214 is a belt-shaped copper foil. Electric contacts 215 are provided at the locations of the second conductor 214 corresponding to the ground probe 210a and the first conductors 211 respectively, and each of the electric contacts 215 is electrically connected with one of the ground probe 210a and the first conductors 211, such that the second conductor 214, the ground probe 210a and the first conductors 211 are electrically shorted together. It is to be understood that the section of the first conductor 211 that is placed on the second conductor 214 is of course not encapsulated by the insulation layer 213. In this embodiment, the electric contact 215 is realized as solder; however, it is not limited thereto. In this embodiment, the extension portion 2100 of each signal probe 210c is abutted on the same surface on which the electric contacts 215 are provided through an insulation member 217.

Figure 5B:
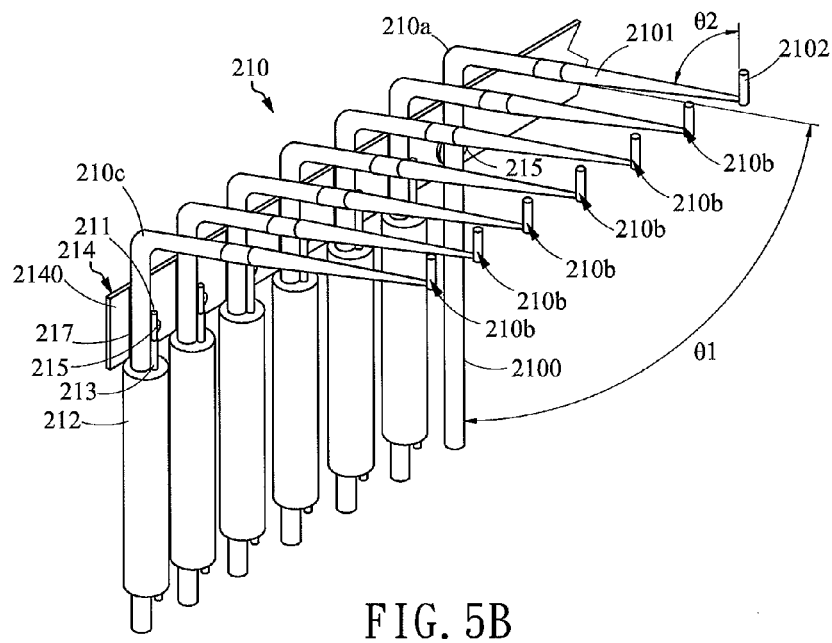
Figure 5C:
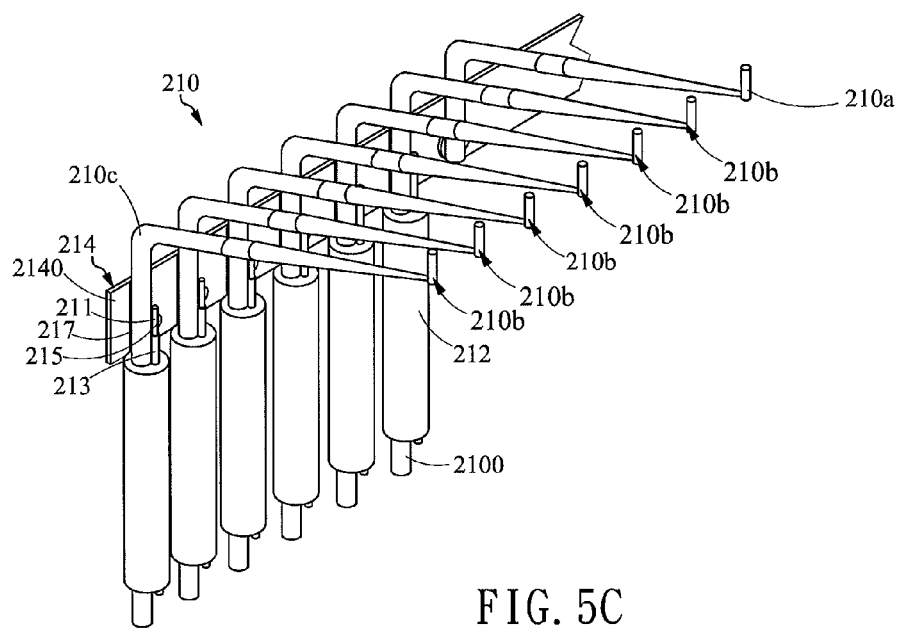

Referring to FIG. 5B, this figure schematically shows an alternate form of a part of the high frequency probe structure of one probe module shown in FIG. 3, which is basically similar to FIG. 5A but having a difference lying in that each signal probe 210c is further coupled with an insulation material 212, which may be realized as, but not limited to, an insulation sleeve or an insulation adhesive tape. Preferably, an insulation sleeve can serve as the insulation material 212, and the insulation sleeve is sleeved onto the signal probe 210c and the first conductor 211. More specifically speaking, a part of the extension portion 2100 of the signal probe 210c is sleeved inside the insulation material 212. By means of the insulation material 212 that is sleeved onto the signal probe 210c and the first conductor 211, the signal probe 210c and the first conductor 211 are abutted with each other and kept a certain insulation distance therebetween so as to realize the effect of high frequency probe. In addition, the insulation distance is restricted by the insulation sleeve, such that the insulation distance will be small than the inner diameter of the insulation sleeve and have a minimum value equal to the thickness of the insulation layer 213. Similarly, an end of the first conductor 211 is electrically connected with the ground probe 210a through the second conductor 214, and the surface of the first conductor 211 corresponding in location to the signal probe 210c is covered with an insulation layer 213. In this embodiment, the first conductor 211 and the insulation layer 213 are combinedly realized as an enamelled wire. That is, the first conductor 211 is a lead wire and the insulation layer 213 is coated around the surface of the lead wire that corresponds in location to the signal probe 210c; however, the design of the first conductor 211 and the insulation layer 213 is not limited thereto. In another embodiment of the present invention, the insulation material 212 may be arranged to be stopped at the edge of the second conductor 214. It is to be mentioned that the extension portion 2100 of the ground probe 210a shown in FIG. 5A and FIG. 5B is configured extending over the electric contact 215 that is contacted with the ground probe 210a for enabling the ground probe 210a to be electrically connected with the ground pad of the circuit board 23. In another embodiment as shown in FIG. 5C, the extension portion 2100 of the ground probe 210a is configured extending to the electric contact 215 that is contacted with the ground probe 210a only. In this case, the first conductor 211 is electrically connected with the ground pad of the circuit board 23.

Figure 5D:
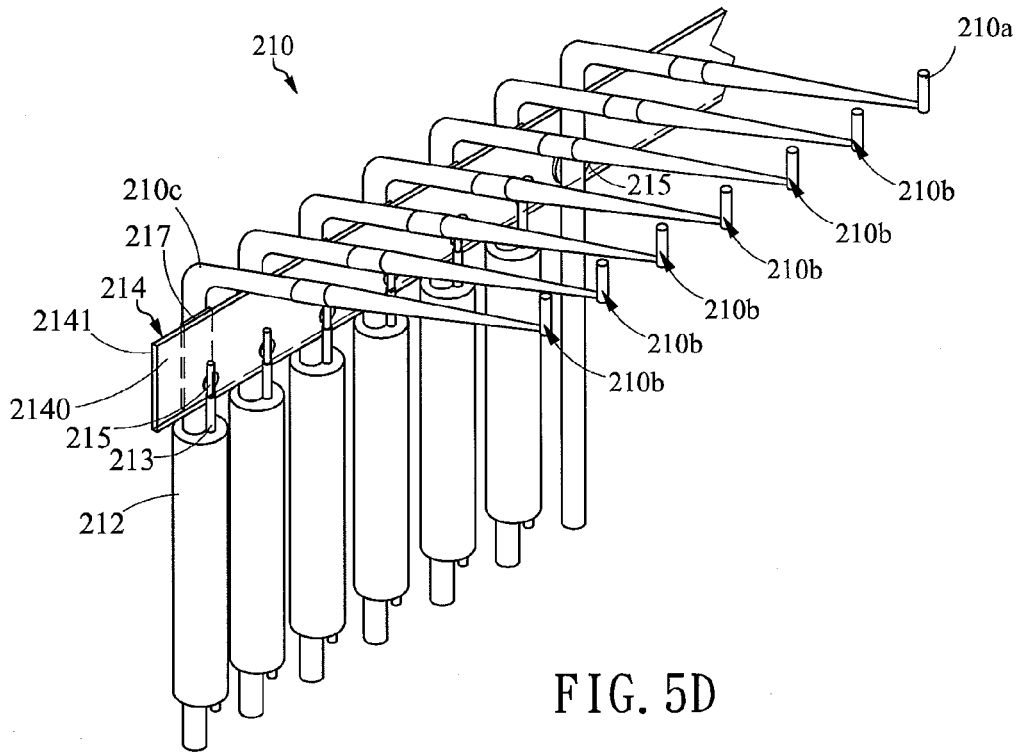
Figure 5E:
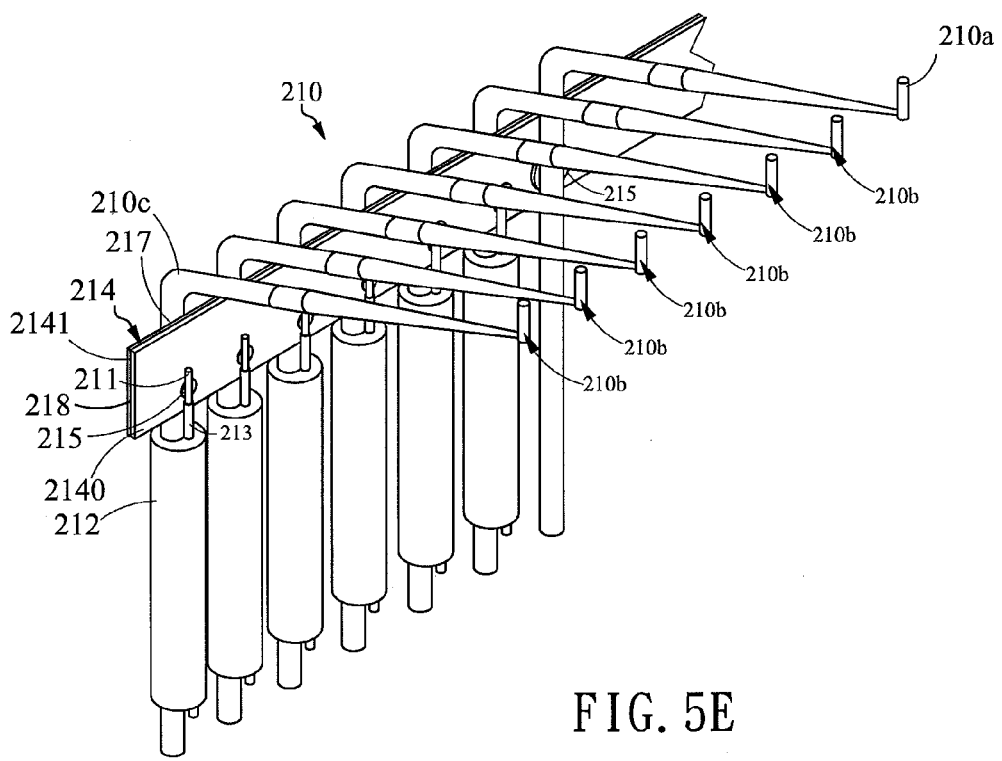

It is to be further mentioned that in FIGS. 5B and 5C the electric contacts 215 are provided at the first surface 2140 of the second conductor 214 and the extension portions 2100 of the signal probes 210c are respectively abutted at the insulation members 217 disposed on the first surface 2140, such that the signal probes 210c and the electric contacts 215 are arranged on the same lateral side of the second conductor 214. However, this arrangement can have various modifications. For example, as shown in FIG. 5D, the second conductor 214 has a first surface 2140, on which the electric contacts 215 each electrically connected with an associated first conductor 211 are provided, and a second surface 2141 opposite to the first surface 2140. The extension portion 2100 of each high frequency signal probe 210b is abutted on the second surface 2141 of the second conductor 214 through one insulation member 217. In addition, as shown in FIG. 5E, on the entire second surface 2141 a layer of insulation member 217 is formed to insulate the second conductor 214 from the signal probes 210c. It will be appreciated that the location that the second conductor 214 can be placed at is of course not specifically limited. The second conductor 214 can be placed at the extension portions 2100 of the high frequency signal probes 210b and the ground probe 210a as shown in FIGS. 5A to 5E; alternatively, it can be placed at the suspension arms 2101 of the high frequency signal probes 210b and the ground probe 210a.

Figure 6C:
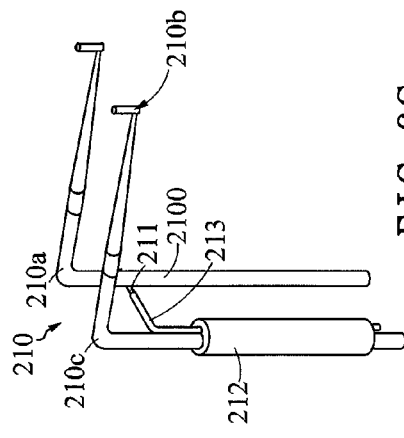
FIGS. 6A to 6D are schematic perspective views showing various alternate forms of the high frequency probe structure of the present invention.
Figure 6D:
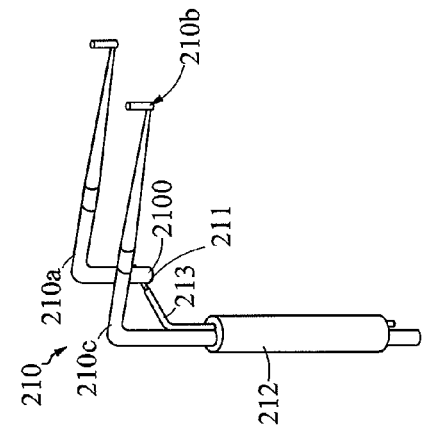
Figure 6A:
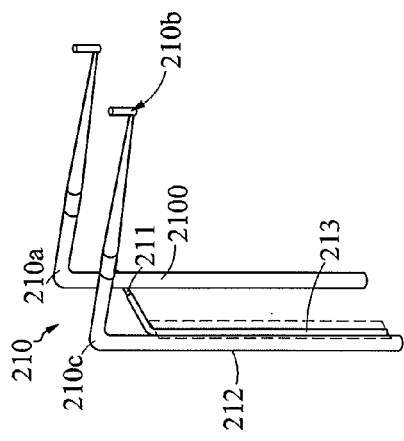
Figure 6B:
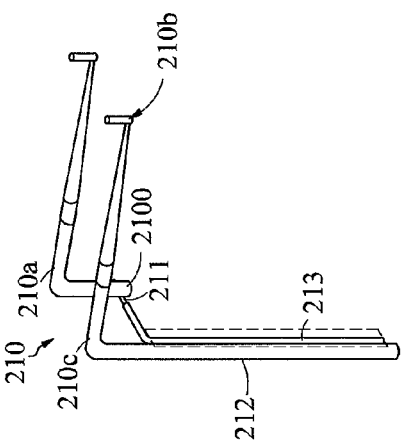

In the above-mentioned embodiments, the number of ground probe 210a and the number of the signal probes 210c in one of the probe modules 21 are set in a one-to-many manner; however, they can be set in a one-to-one manner as shown in FIGS. 6A to 6D. Referring to FIGS. 6A and 6B that schematically show two alternate forms of the high frequency probe structure of the present invention, because the ground probe 210a and signal probe 210c are arranged having a one-to-one relationship in this embodiment, an insulation layer 213 is provided at an area, denoted by broken lines in FIGS. 6A and 6B, between the associated signal probe 210c and first conductor 211 so as to keep the signal probe 210c from the associated first conductor 211 at a predetermined insulation distance. In FIG. 6A, the extension portion 2100 of the ground probe 210a is configured extending over the contact location where the first conductor 211 is electrically connected with the extension portion 2100 of the ground probe 210a; however, in FIG. 6B, the extension portion 2100 of the ground probe 210a is configured extending only to the contact location where the first conductor 211 is electrically connected with the extension portion 2100 of the ground probe 210a.

FIGS. 6C and 6D schematically show another two alternate forms of the high frequency probe structure of the present invention, in which a one-to-one relationship between the ground probe 210a and the signal probe 210c is adopted, and the insulation material 212 is embodied as an insulation sleeve, which is sleeved onto the signal probe 210c and the first conductor 211. The first conductor 211 is wrapped by the insulation layer 213 and electrically connected with the corresponding ground probe 210a directly. In FIG. 6C, the extension portion 2100 of the ground probe 210a is configured extending over the contact location where the first conductor 211 is electrically connected with the extension portion 2100 of the ground probe 210a; however, in FIG. 6D, the extension portion 2100 of the ground probe 210a is configured extending only to the contact location where the first conductor 211 is electrically connected with the extension portion 2100 of the ground probe 210a. As for the design purpose of the various lengths of the extension portions of the ground probes in FIG. 6A to 6D, it is the same as the design purpose of the ground probes shown in FIGS. 5A to 5D, which has already been described in previous paragraphs, so that the detailed description thereof will not be stated here again.

Figure 7A:
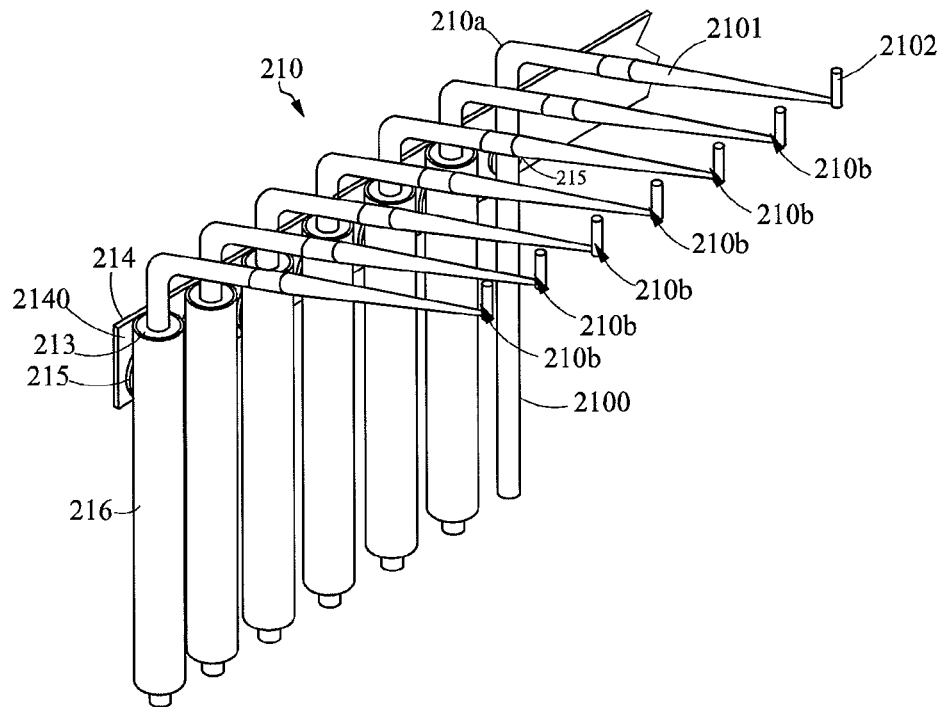
FIG. 7A is a schematic perspective view showing another alternate form of the high frequency probe structure of the present invention.
Figures 7B, 7C:
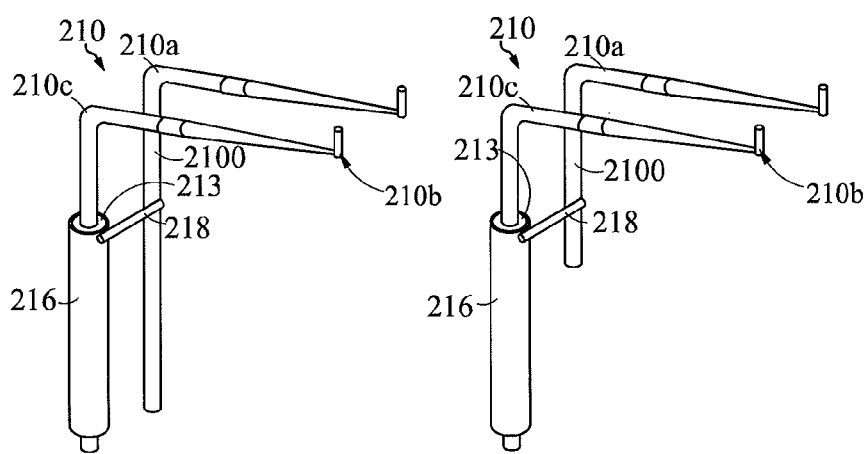
FIG. 7B is a schematic perspective view showing that the ground probe corresponds in number to the signal probe in a one-to-one manner.
FIG. 7C is a similar to FIG. 7B but showing an alternate form of the ground probe.

Referring to FIG. 7A, this figure is a schematic perspective view showing still another alternate form of the high frequency probe structure of the present invention, which is basically similar to FIG. 5C but having differences lying in that the insulation layer 213 is embodied as an insulation sleeve sleeved onto the signal probe 210c and the first conductor is realized as a metal film 216 provided on the circumference surface of the insulation layer 213 and electrically connected with the ground probe 210a through one of the electric contacts 215 on the second conductor 214, such that the metal film 216 on the insulation layer 213 of each of the high frequency signal probes 210b is electrically connected with the ground probe 210a. In FIG. 7A, the ground probe 210a and the signal probes 210c have a one-to-many relationship; however, they can be set in a one-to-one manner as shown in FIGS. 7B and 7C. Referring to FIGS. 7B and 7C, the extension portion 2100 of the ground probe 210a is electrically connected with the metal film 216 through a lead wire 218. In FIG. 7B, the extension portion 2100 of the ground probe 210a is configured extending over the contact location where the lead wire 218 is electrically contacted with the extension portion 2100 of the ground probe 210a; however, in FIG. 7C the extension portion 2100 of the ground probe 210a is configured extending to the contact location where the lead wire 218 is electrically contacted with the extension portion 2100 of the ground probe 210a only. For the lead wire 218, an enamelled wire or a bare lead wire without insulation layer may be used. If an enamelled wire serves as the lead wire 218, the portion of the lead wire 218 that is electrically contacted with the ground probe 210a is provided with on insulation coating. As for the design purpose of the structural differences of the ground probes 210a and the lead wires 218 in FIGS. 7B and 7C, it is the same as that shown in FIGS. 5C and 5D, such that the detailed description thereof will not be stated here again. In addition, it is to be mentioned that the way of electrically connecting the lead wire 218 between the metal film 216 and the ground probe 210a can be carried out by, but not limited to, soldering.

Referring to FIGS. 2A, 2B, 9A and 9B, the connection between the fixing member 219 and the series of probes 210 will be detailedly illustrated hereinafter. The fixing member 219 may be made of, but not limited to, engineering plastics, Bakelite or ceramic material. Preferably, the fixing member 219 in this embodiment is made of ceramic material. After the extension portion 2100 of each probe 210a or 210b has been arranged on the fixing member 219, an adhesive 24, such as epoxy resin, is used to firmly fasten the probe 210a or 210b to the fixing member 219. It is to be mentioned that the location that the adhesive is applied to can be selected based on the actual need and is not limited to the locations shown in the drawings. Thereafter, the whole probe module 21 is embedded into the corresponding groove of the substrate 20. The groove of the substrate 20 can be selected from the groove 201 of FIG. 4A or the groove 202 of FIG. 4B. In this embodiment, the groove 202 of FIG. 4B is used. When the whole probe module 21 is embedded into the corresponding groove 202, an adhesive 24a can be applied at the conjunction between the probe module 21 and the substrate 20 to enhance the connection strength between the probe module 21 and the substrate 20. It is to be understood that the location that the adhesive 24a, through which the probe module 21 is connected with the substrate 20, is applied to is not limited to the one shown in this embodiment. A suitable conjunction can be always selected, based on the actual need, for application of the adhesive so as to enhance the connection strength. Though the aforesaid first through holes 204 are individual through holes, they can be modified to be communicated with each other so as to form a single through groove for the pass of the probes 210a and 210b.

FIG. 8 shows the arrangement of the probe modules, the fixing members and the substrate. In this embodiment, each probe 210a or 210b is firstly adhered to the fixing member 219a by adhesive 24 to form a single probe module 21 in such a way that the extension portion 2100 of each probe is abutted at a lateral side of the fixing member 219a and substantially perpendicular to the surface of the substrate 20. In order to adhesively fasten the probe 210a or 210b to the fixing member 219a, the suspension arm 2101 is connected with the fixing member 219a through adhesive 24.

Next, each probe module 21 thus obtained is embedded into the corresponding groove 202 of the substrate 20. In the case that the substrate 20 shown in FIG. 4B is used, the extension portion 2100 of each probe 210a or 210b will extend through a corresponding first through hole 204 and protrude out of the substrate 20. Thanks to the design of the first through hole 204, the extension portion 2100 that protrudes out of the substrate 20 can be well positioned for facilitating transmission of the electric signal. In order to fixedly fasten the probe module 21 on the substrate 20, an adhesive 24b can be filled in the gap between the probe module 21 and the groove 202 to enhance the connection strength therebetween after the probe module 21 is received in the corresponding groove 202. In another embodiment, an adhesive 24 may be used between the suspension arm 2101 of the probe 210a or 210b and the substrate 20 to enhance the connection strength therebetween. In addition, it is to be mentioned that in another embodiment the fixing member 219 in FIGS. 2A and 2B or the fixing member 219a in FIG. 8 may not be received in the groove 202 but connected on the surface of the substrate 20 corresponding to the groove 202 directly. In this case, the groove 202 may be a through groove having an opening width smaller than the width of the fixing member 219 or 219a for allowing the pass of the corresponding probes only. As for the connection between the fixing member 219 or 219a and the substrate 20, it can be achieved by adhesion by using epoxy resin.

The fixing members 219 shown in FIGS. 2A to 2B and the fixing member 219a shown in FIG. 8 are elongated prisms individually. In another embodiment, as shown in FIGS. 9A and 9B, the fixing members are configured to be integrally connected with each other to form a ring-like construction, such as a one-piece construction having a rectangle-shaped or U-shaped configuration. That is, FIG. 9A shows a fixing member 219b having a U-shaped configuration and FIG. 9B shows a fixing member 219c having a rectangle-shaped configuration. These fixing members shown in FIGS. 9A and 9B can serve as the fixing members for the probe modules 21 of FIGS. 2A and 2B. Referring to FIGS. 2A and 2B again, each probe module 21 comprises at least one ground probe 210a and at least one high frequency signal probe 210b including a first conductor 211 and a signal probe 210c. The corresponding relationship between the number of the ground probes 210a and the number of the signal probes 210c may be set in a one-to-one or one-to-many manner. The arrangement between the at least one ground probe 210a and the at least one signal probe 210c can be the one selected from FIGS. 5A to 7C. In addition, as previously stated, in the structures shown in FIGS. 5A to 7C, the position of the second conductor 214 may be changed to the suspension arms 2101 of the high frequency signal probes 210b and the ground probe 210a.

As shown in FIGS. 2A and 2B, each ground probe 210a penetrates through the substrate 20 and the interposing plate 22, runs through the circuit board 23 via the third opening 230 and then is electrically connected with a contact pad 231 on the top surface of the circuit board 23. Similarly, each signal probe 210c penetrates through the substrate 20 and the interposing plate 22, runs through the circuit board 23 via the third opening 230 and then is electrically connected with a contact pad 232 on the top surface of the circuit board 23. It is to be noted that the contact pad 231 adapted for being electrically connected with the ground probe 210a is a grounding contact pad, and the contact pad 232 adapted for being electrically connected with the signal probe 210c is a high frequency signal contact pad for transmission of high frequency signal. In addition, an end of the first conductor 211 is electrically connected with the second conductor 214 through the electric contact 215, and the other end of the first conductor 211 penetrates through the interposing plate 22, runs through the circuit board via the third opening 230 and then is electrically connected with the contact pad 233, which is a grounding contact pad, on the top surface of the circuit board 23. In this embodiment, the second conductor 214 is installed in the groove 202 of the substrate 20, and at the meantime the probe 210a or 210c penetrates through the groove 202. As for the adhesive 24, it is used to hold the second conductor 214 and the probe 210a or 210b in position. Further, the first conductor 211 and the probe 210c are received inside the insulation material 212, which is in turn received in a second groove 222 of the interposing plate 22.

For enabling the signal probe 210c to function having a high frequency detecting effect, it is needed to have impedance matching for the signal probe 210c. In this embodiment, the impedance matching is achieved by extending the first conductor 211 and the insulation material 212 to a location of the signal probe 210c that is located around the top surface of the circuit board 23, and then making the first conductor 211 be electrically connected with the contact pad 233. As shown in FIGS. 2A and 2B, the insulation material 212 has a bottom end stopped at an edge of the second conductor 214, and a top end extending upwardly to a location around the top surface of the circuit board 23. In another embodiment, the probe module further comprises a fixing member 219, such that the ground probe 210a and the signal probes 210c can be installed and positioned on the fixing member 219 in advance, and thereafter, the fixing member 219 carrying the probes 210a and 210c can be embedded in a groove 202 of the substrate 20 and fixed in position by the adhesive 24. It will be appreciated that the way of installing and positioning a plurality of ground probes 210a and a plurality of signal probes 210c on the substrate 20 is a prior art well known by the person skilled in the art, which is not limited to the way using the fixing member 219 as illustrated in this embodiment. Furthermore, the substrate 20 can be provided with none of any grooves 202, and in this case the fixing member 219 can be directly mounted on the surface of the substrate 20.

Figure 10A:
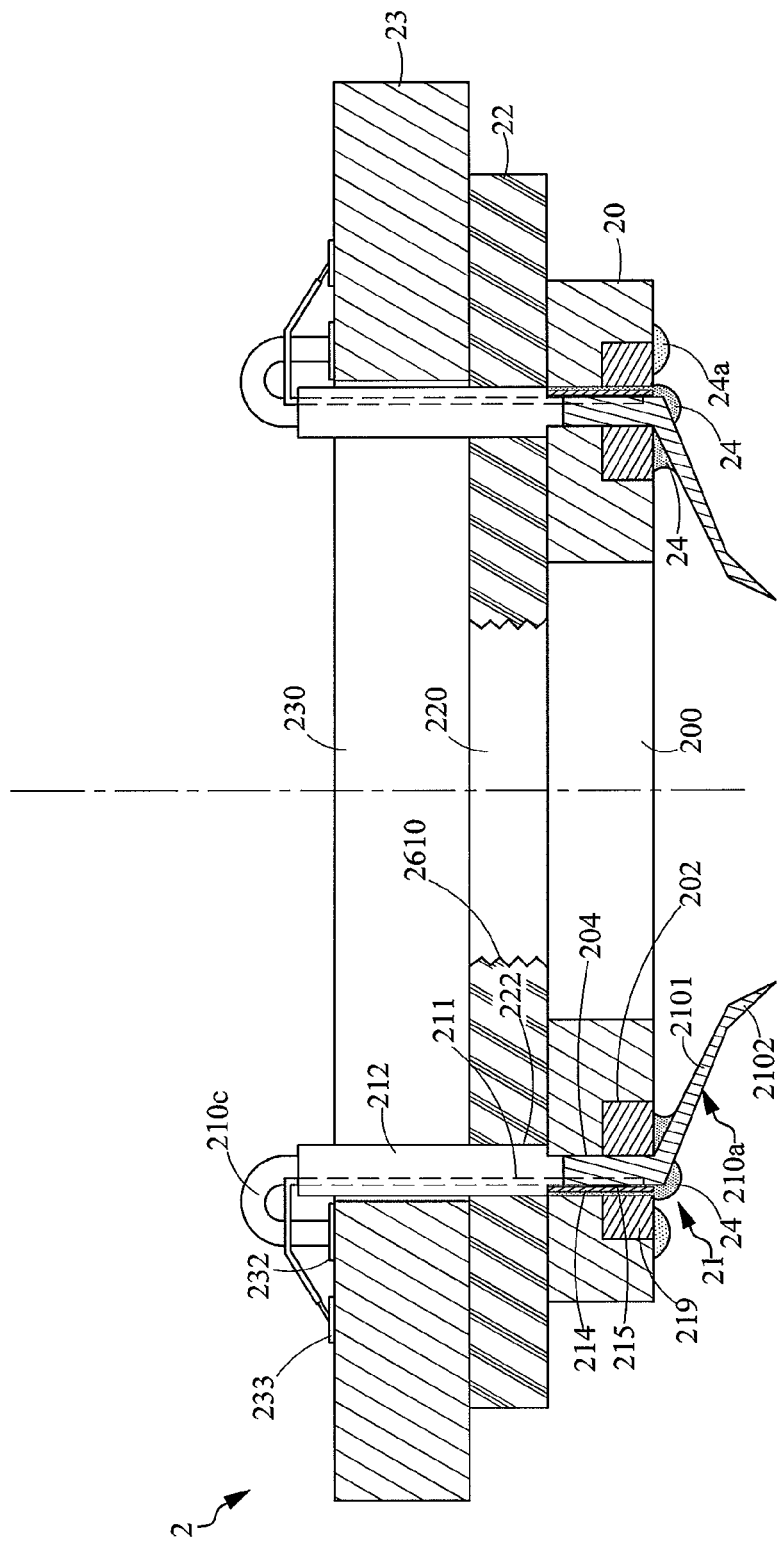
FIGS. 10A to 10E are cross-sectional views of the high frequency probe cards according to various embodiments of the present invention.

The interposing plate 22 is mounted on the substrate 20 and provided with a second opening 220 in alignment with the first opening 200 of the substrate 20. The circuit board 23 is mounted on the interposing plate 22, and the third opening 230 of the circuit board 23 is aligned with the second opening 220 and the first opening 200. In the aforesaid embodiment, the ground probe 210a is electrically connected with the grounding contact pad 231 on the top surface of the circuit board 23. In another embodiment as shown in FIG. 10A, the ground probe 210a is not connected with the grounding contact pad 231, but indirectly connected with the grounding contact pad 233 by the first conductor 211 that extends through the third opening 230 to the top surface of the circuit board 23 and is connected with the grounding contact pad 233. In addition, it is to be specifically mentioned that the purpose that the ground probes 210a, the signal probes 210c and the first conductors 211 of the present invention are configured to be electrically connected on the top surface of the circuit board 23 is to facilitate the electric connections between the probes and the contact pads during processing.

Figure 10B:
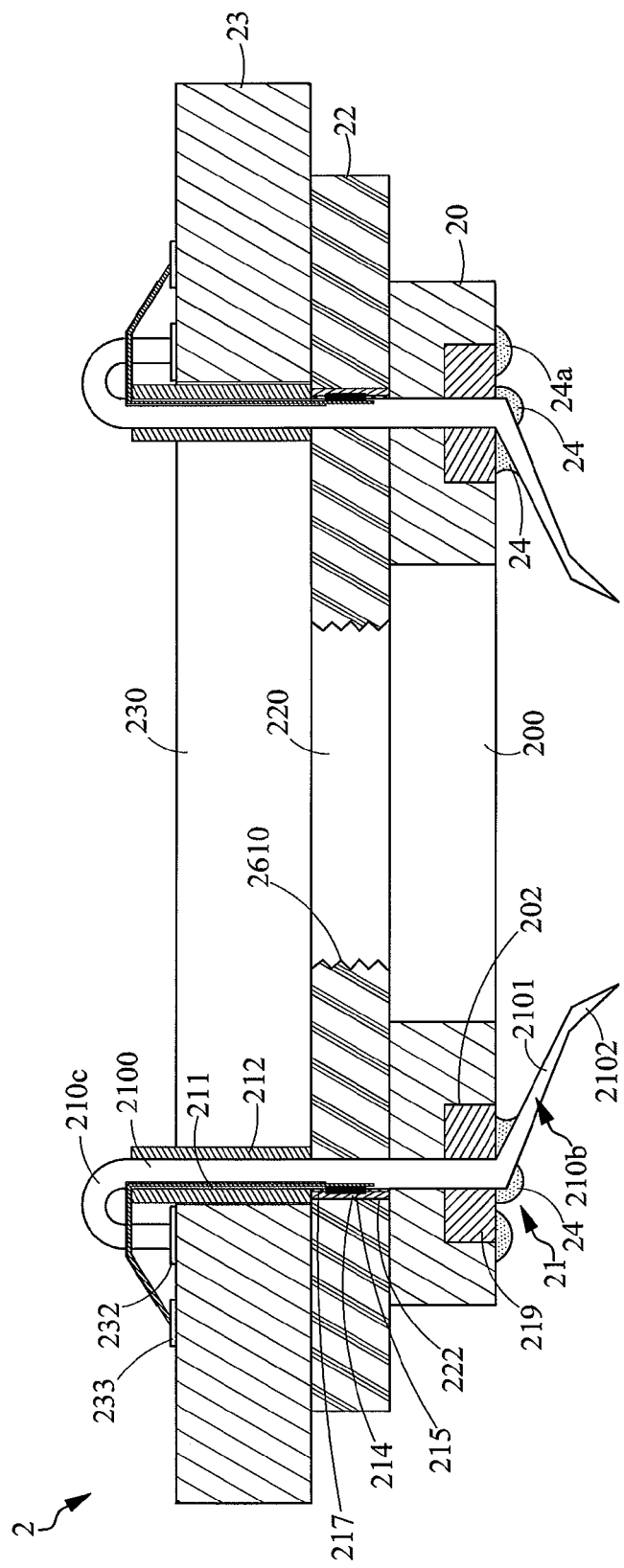

FIG. 10B is a sectional view of a high frequency probe card according to another embodiment of the present invention. The high frequency probe card in FIG. 10B is basically the same as that disclosed in FIG. 10A with the difference lying in that the second conductor 214 in this embodiment is received in a second groove 222 of the interposing plate 22 and the first conductor 211 and the extension portion 2100 of the signal probe 210c both run through the second groove 222. In addition, the first conductor 211 and the extension portion 2100 of the signal probe 210c are received inside the insulation material 212, which is in turn received in the third opening 230 of the circuit board 23. In this embodiment, the bottom end of the insulation material 212 is stopped at the interposing plate 22 and abutted with the second conductor 214, and the top end of the insulation material 212 extends to a location around the top surface of the circuit board 23.

Figure 10C:
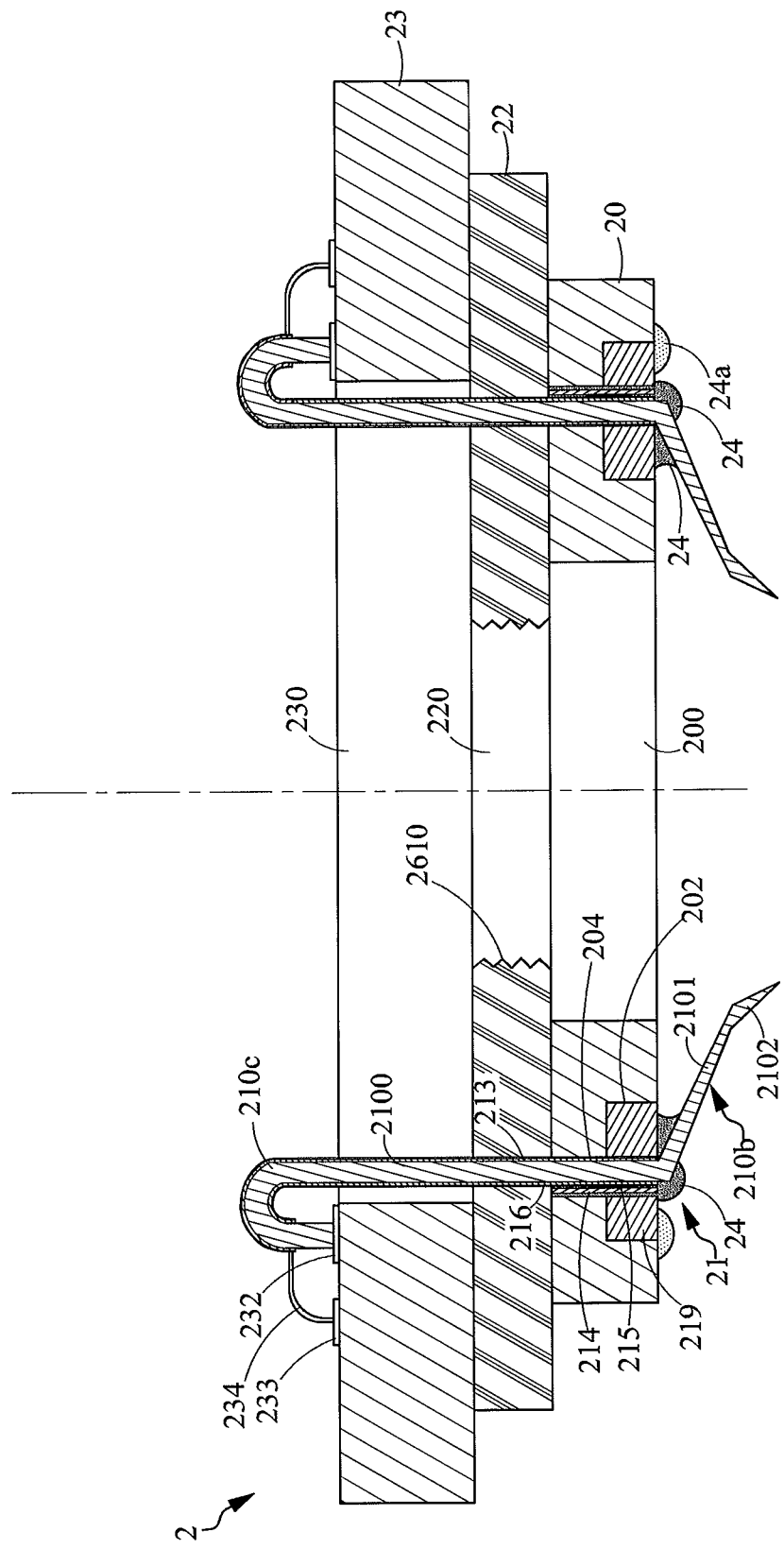
Figure 10D:
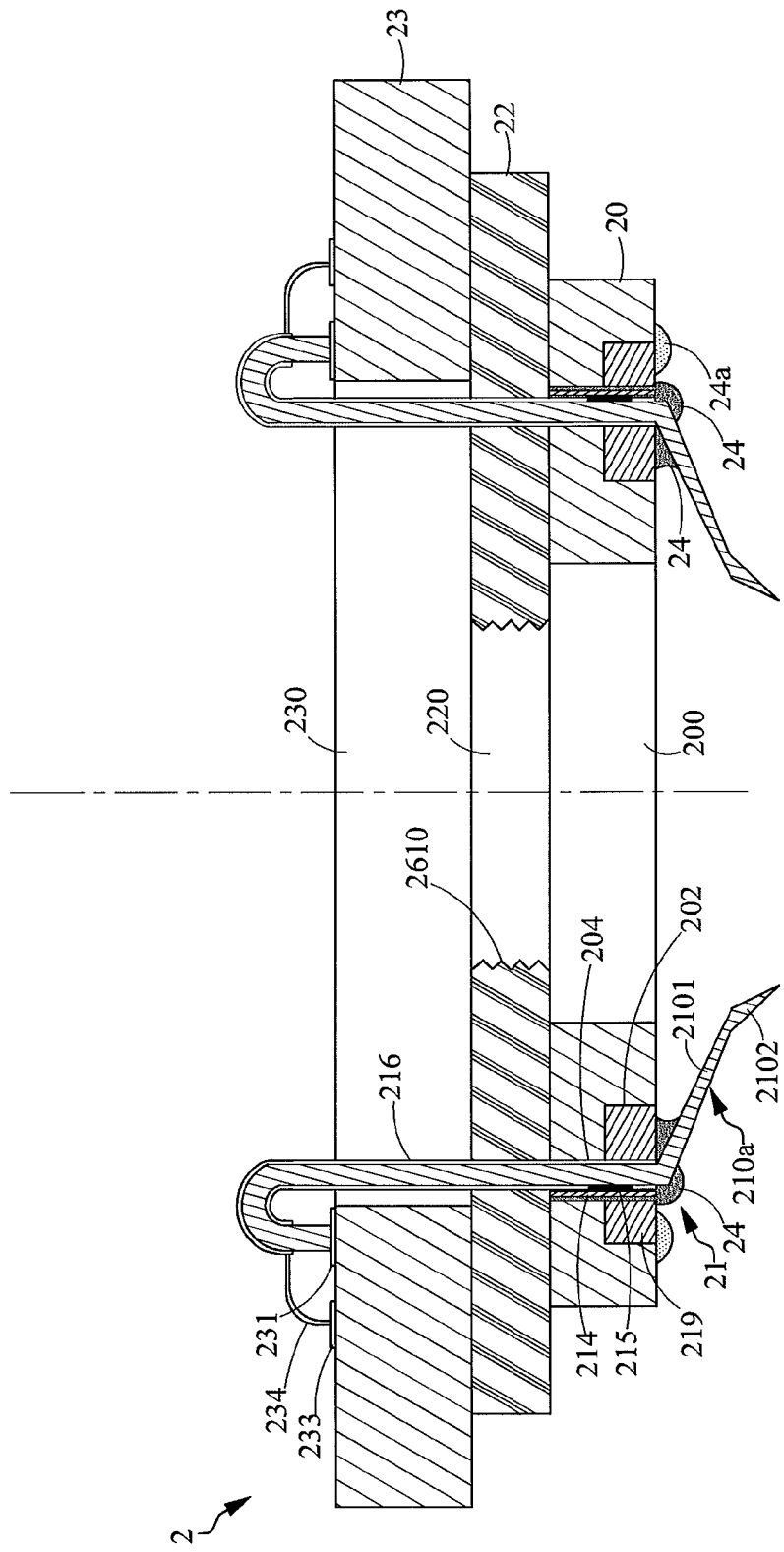

Referring to FIGS. 10C and 10D, this embodiment is designed based on the high frequency structure of FIG. 10A basically. Specifically speaking, the second conductor 214 is received in the groove 202 of the substrate 20, and a bottom section of the metal film 216 covering on the insulation layer 213 is electrically connected with the electric contact 215. In addition, the second conductor 214 is further electrically connected with the ground probe 210a through an electric contact 215, and the extension portion 2100 of the ground probe 210a is electrically connected with the contact pad 231. For enabling the signal probe 210c to function having a high frequency detecting effect, it is needed to have impedance matching for the signal probe 210c. In this embodiment, the impedance matching is achieved by extending upwardly the insulation layer 213 associated with the metal film 216 to a location of the signal probe 210c that is located around the top surface of the circuit board 23, and then making the metal film 216 be electrically connected with the contact pad 233 through a conductor or a lead wire 234. The other structural features of this embodiment or the modifications thereof can be easily understood by reference to FIG. 2A, 2B or 10B; therefore, the detailed descriptions in these matters are not needed to be repeatedly illustrated hereunder.

Based on the structure shown in FIG. 10A, the position of the second conductor 214 can be shifted to the suspension arm 2101 of the signal probe 210c of the high frequency signal probe 210b in still another embodiment of the present invention. In this case, the second conductor 214 will be disposed between the fixing member 219 and the suspension arm 2101 and fixed in position by the adhesive 24.

Figure 10E:
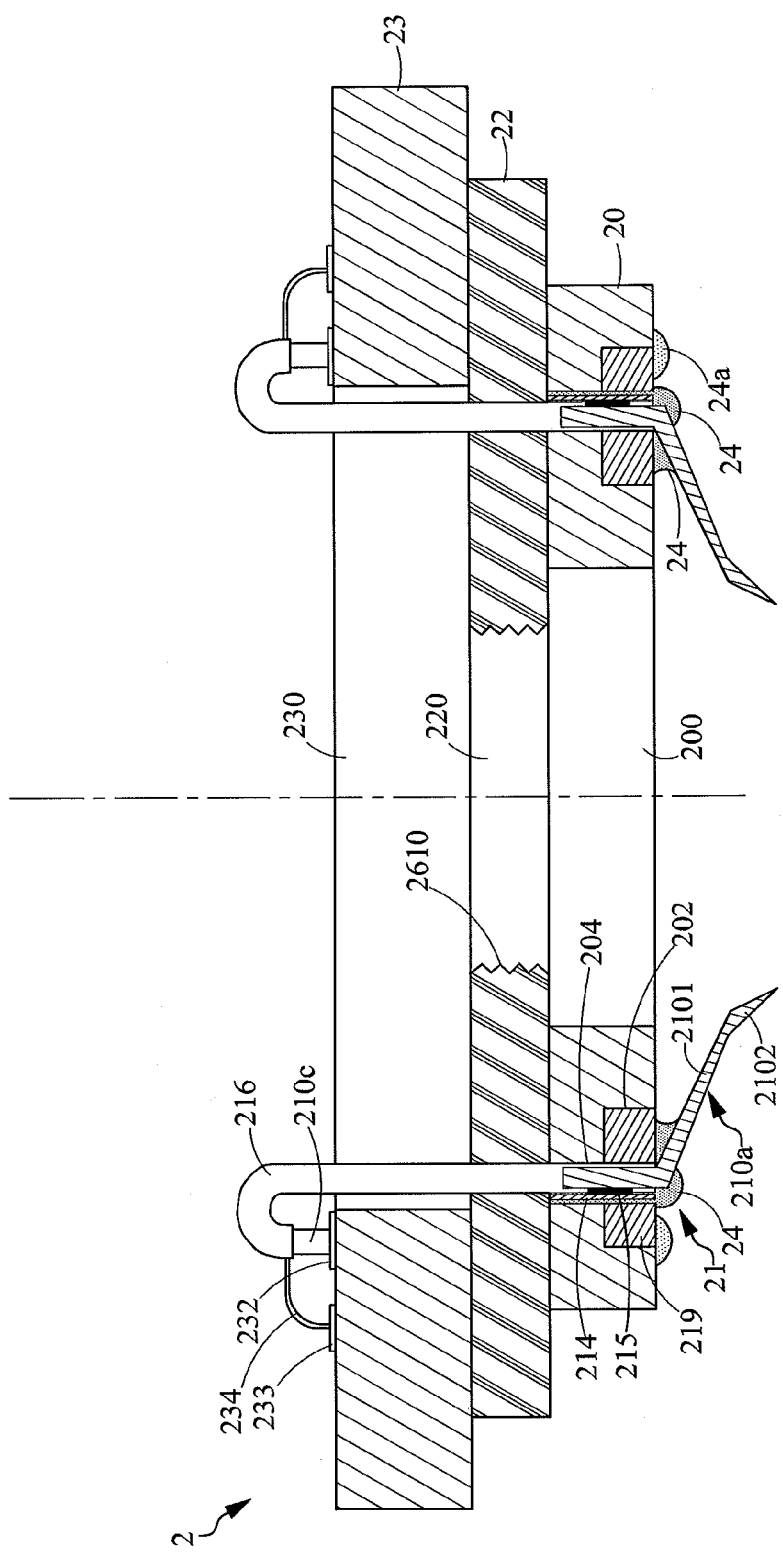

In the aforesaid embodiments, the ground probe 210a may be configured to be electrically connected with the grounding contact pad 231 on the circuit board 23. In still another embodiment, the round probe 210a may be configured to extend to the second conductor 214 only, as shown in FIG. 10E, and in this case, the relatively shorter N-type ground probe 210a is electrically contacted with the second conductor 214. Further, in the aforesaid FIGS. 2A, 2B, and 10A to 10E, the contact pads 231, 232 and 233 are annularly arranged on the top surface of the circuit board 23 around the third opening 230.

Referring to FIG. 2A again, in this embodiment the first opening 200, the second opening 220 and the third opening 230 combinedly form an accommodation for accommodating a lens adjusting mechanism 26 therein. In this embodiment, the lens adjusting mechanism 26 comprises a lens holder 260 and a position adjusting structure 261. The lens holder 260 is coupled into the second opening 220 and provided with an accommodation 2600 for receiving a lens 27 therein, and a flange 2601. As shown in FIG. 2A, the lens 27 is positioned inside the accommodation 2600 by thread engagement, and the thickness D defined between the inner wall surface and outer wall surface of the lens holder 260 at the place where the lens 27 is to be positioned is more than or equal to 0.5 mm and less than or equal to 1.5 mm, i.e. the thickness D satisfies the equation 0.5 mm≤D≤1.5 mm. The flange 2601 is an annular protrusion surrounding around the periphery of the opening of the accommodation 2600 in this embodiment.

The position adjusting structure 261 is provided at between the lens holder 260 and the second opening 220 and operatable to allow the lens holder 260 to do a position adjusting motion in the second opening 220 along the Z-axis direction. In this embodiment, the position adjusting structure 261 includes a first thread 2610 formed on the inner wall surface of the interposing plate 22 surrounding the second opening 220, a second thread 2611 formed on the outer wall surface of the lens holder 260 and screwingly engageable with the first thread 2610, and an elastic member 2612 having a hollow portion 2613 for allowing the part of the lens holder 260 having the second thread 2611 to pass therethrough for enabling the second thread 2611 to be screwingly engaged with the first thread 2610. The elastic member 2612 has an end stopped at the interposing plate 22 and the other end stopped at the flange 2601. For the elastic member 2612, a compression spring can be used as shown in this embodiment. When the lens holder 260 is screwingly engaged with the interposing plate 22, the elastic member 2612 is compressed to store a compression force.

Since the second thread 2611 of the lens holder 260 is screwingly engaged with the first thread 2610 in the second opening 220, the lens holder 260 can be operated to move downwards or upwards by turning the lens holder 260 clockwise or counterclockwise so as to adjust the focus of the lens 27 in the lens holder 260 to be set on the device under test 90. In addition, because the elastic member 2612 is restrained by the flange 2601 of the lens holder 260 when the lens holder 260 is screwingly engaged with the interposing plate 22, the rebound force of the elastic member 2612 due to compression will exert on the lens holder 260 and the interposing plate 22 to make the first thread 2610 and the second thread 2611 be firmly engaged with each so as to eliminate the backlash between the engaged first thread 2610 and second thread 2611. As s result, the position of the lens holder 260 can be precisely adjusted by the above-mentioned position adjusting motion without being affected by the aforesaid backlash.

Figure 11B:
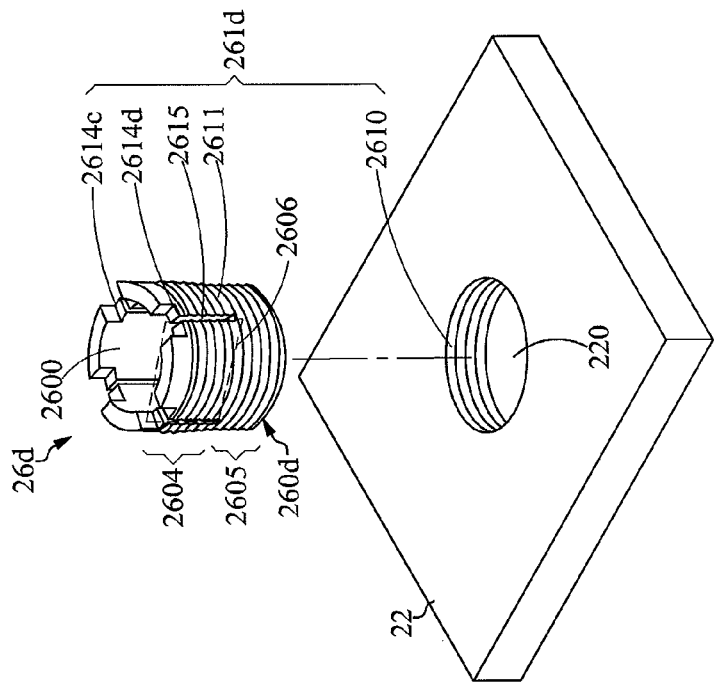
FIGS. 11A to 11C are schematic perspective views of the lens adjusting mechanisms according to various embodiments of the present invention.
Figure 11A:
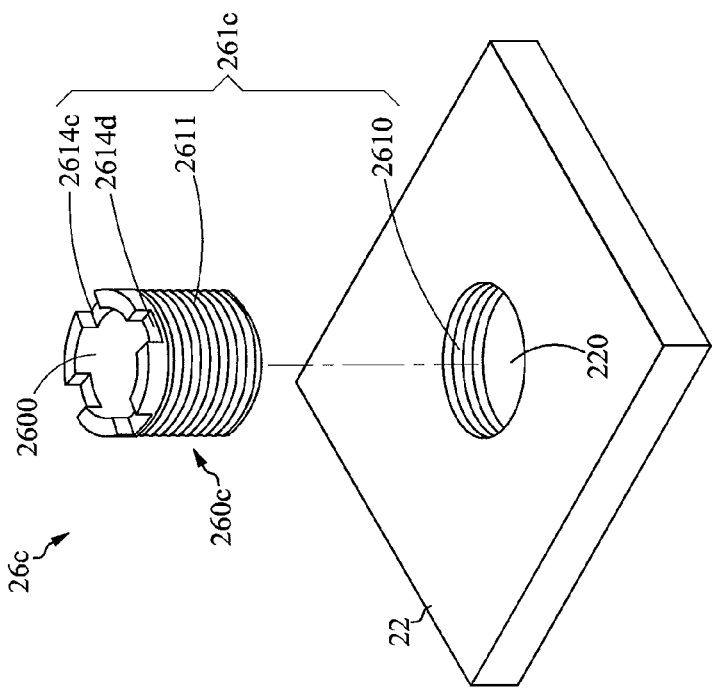

FIG. 11A shows a schematic perspective view of the lens adjusting mechanism according to another embodiment of the present invention. In this embodiment, the lens adjusting mechanism 26c comprises a lens holder 260c and a position adjusting structure 261c. The lens holder 260c has a cylindrical configuration with an accommodation 2600. The position adjusting mechanism 261c is composed of two pairs of adjustment notches 2614c and 2614d formed on the top surface of the lens holder 260c and symmetrically arranged around the opening of the accommodation 2600, a first thread 2610 formed on the inner wall surface of the interposing plate 22 surrounding the second opening 220, and a second thread 2611 formed on the outer wall surface of the lens holder 260c and screwingly engageable with the first thread 2610. In this embodiment, the elastic member of FIG. 2A is not used for minimizing the adverse effect of the backlash of the engaged threads. Instead, the adverse effect of the backlash is minimized by increasing the engaging ratio between the first and second threads 2610 and 2611 or by applying escape-preventing adhesive in between the first thread 2610 and the second thread 2611 so as to enhance the accuracy of position adjusting motion. In still another embodiment, the engaging ratio of the engaged threads may be increased by using different materials, such as engineering plastics or other metals, to manufacturing the lens holder 260c and the interposing plate 22. In this embodiment, the lens holder 260c and the interposing plate 22 may be made having different hardness, i.e. the hardness of the interposing plate 22 is greater than that of the lens holder 260c or vice versa, so as to enhance the engaging ratio of the engaged threads. Preferably, the interposing plate 22 is made having a hardness greater than that of the lens holder 260c in this embodiment. In addition, the thickness D defined between the inner wall surface defining the accommodation 2600 and the outer wall surface of the lens holder 260 corresponding in location to the accommodation 2600 satisfies the equation 0.5 mm≤D≤1.5 mm.

The operating way of the lens adjusting structure shown in FIG. 11A is further described hereinafter. Since two pairs of adjustment notches 2614c and 2614d are provided in this embodiment, the operator can easily control the lens holder 260c to move downward or upward in the Z-axis direction by engaging a cross-shaped jig with the two pairs of the adjustment notches 2614c and 2614d and then driving the lens holder 260c to turn clockwise or counterclockwise. It is to be understood that the number and the arrangement of the adjustment notches are not limited to the disclosure in this embodiment though there are two pairs of the adjustment notches 2614c and 2614d shown in this embodiment. For example, at least one engagement notch may be used for a person skilled in the art based on the design spirit of this embodiment. In still another embodiment, a pair of adjustment notches may be used, and in this case the operator can engage a linear-shaped jig with the pair of the adjustment notches and then drive the lens holder 260c to turn. In addition, neither the flange 2601 of the lens holder 260 nor the elastic member 2612 shown in FIG. 2A is provided in this embodiment, such that the width of the interposing plate 22 can be reduced, resulting in that the total volume of the lens adjusting mechanism 26c can be further reduced.

FIG. 11B shows a schematic perspective view of the lens adjusting mechanism according to still another embodiment of the present invention. In this embodiment, the lens adjusting mechanism 26d comprises a lens holder 260d and a position adjusting structure 261d. The lens holder 260d and the position adjusting structure 261d are basically the same as those disclosed in FIG. 11A; however, the difference therebetween lies in that the outer wall surface of the lens holder 260d is divided into a first zone 2604 and a second zone 2605, and the position adjusting structure 261d further comprises a plurality of slits 2615 equiangularly formed at the body of the first zone 2604 of the lens holder 260d, such that the first zone 2604 of the lens holder 260d is configured having a plurality of engagement adjusting portions 2606 expanding inclinedly and outwardly. As a result, the diameter of the first zone 2604 having a part of the second thread 2611 is gradually decreased from the top to the bottom of the first zone 2604; however, the diameter of the second zone 2605 having the other part of the second thread 2611 maintains constant.

The operating way of the lens adjusting structure 261d having two pairs of adjustment notches 2614c and 2614d shown in FIG. 11B is same as that of the lens adjusting structure 261c shown in FIG. 11A; therefore, the detailed description in this matter is not repeatedly illustrated hereunder. In this embodiment, a part of the second thread 2611 is distributed on the first zone 2604 of the lens holder 260d, the other part of the second thread 2611 is distributed on the second zone 2605 of the lens holder 260d, and the first zone 2604 has a diameter greater than that of the second zone 2605; therefore, when the lens holder 260d is screwingly engaged with the interposing plate 22 through the engagement of the second thread 2611 on the second zone 2605 with the first thread 2610 and continuously moves downwards to allow the second thread 2611 on the engagement adjusting portions 2606, i.e. the first zone 2604, to engage with the first thread 2610, the outwardly expanded engagement adjusting portions 2606 will be restricted and compressed by the second opening 220 of the interposing plate 22 to contract toward inside of the opening of the accommodation 2600 of the lens holder 260d as the lens holder 260d continuously moves downward, and meanwhile the slits 2615 provide sufficient buffer spaces needed for compression. By means of aforesaid compression action, each engagement adjusting portion 2606 produces an outward thrust exerting on the wall of the second opening 220, such that the second thread 2611 can be firmly engaged with the first thread 2610 to prevent the adverse effect of the backlash between engaged threads as the lens holder 260d moves upwards and downwards, thereby enhancing the accuracy of the position adjusting motion.

Figure 11C:
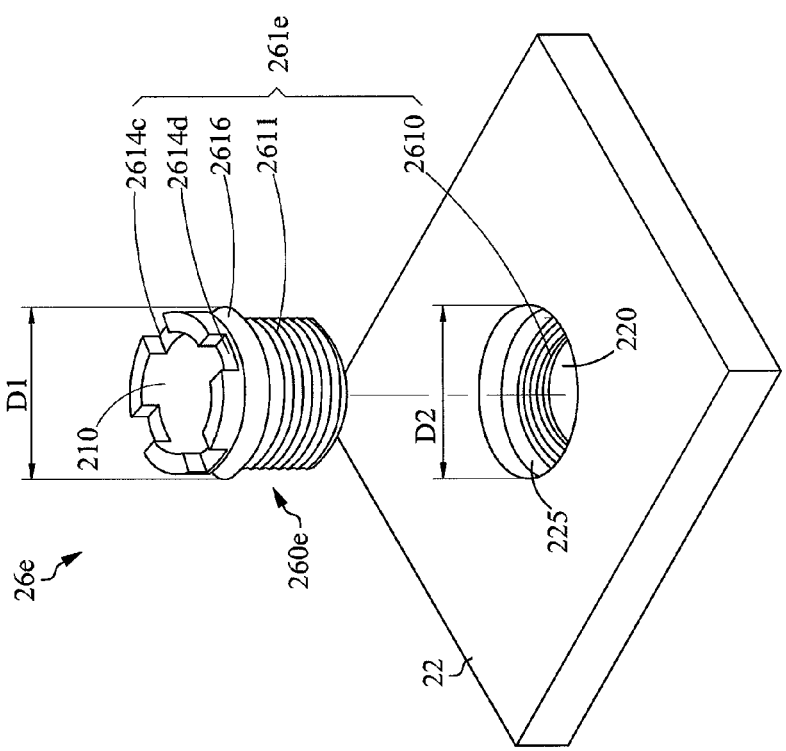

FIG. 11C shows a schematic perspective view of the lens adjusting mechanism according to still another embodiment of the present invention. In this embodiment, the lens adjusting mechanism 26e comprises a lens holder 260e and a position adjusting structure 261e. The lens holder 260e and the position adjusting structure 261e are basically the same as those disclosed in FIG. 11A; however, the difference therebetween lies in that the position adjusting structure 261e further comprises a flexible ring 2616, such as but not limited to O-ring, which is sleeved onto the lens holder 260e and located at the topmost portion of the second thread 2611. In addition, the interposing plate 22 is further provided with an annular recess 225 surrounding around and communicating with the second opening 220. The outer diameter D1 of the flexible ring 2616 is greater than or equal to the caliber D2 of the annular recess 225; therefore, when the lens holder 260e is threaded with the interposing plate 22, the flexible ring 2616 will be jammed by the wall of the annular recess 225 to make lens holder 260e and the annular recess 225 be tightly connected with each other, thereby enhancing the securing effect of the lens holder 260e to the interposing plate 22. In this embodiment, the caliber D2 of the annular recess 225 is greater than the caliber of the opening 220 as shown in FIG. 11C. In still another embodiment of the present invention, the caliber D2 of the annular recess 225 may be equal to that of the opening 220 according to the actual need.

The operating way of the lens adjusting structure 261e having two pairs of adjustment notches 2614c and 2614d shown in FIG. 11C is same as that of the lens adjusting structure 261c shown in FIG. 11A; therefore, the detailed description in this matter is not repeatedly illustrated hereunder. When the second thread 2611 is engaged with the first thread 2610 provided on the wall of the second opening 220 and the lens holder 260e is moved downward in Z-axis direction by tuning the lens holder 260e clockwise, the flexible ring 2616 will contact and then be squeezed by the wall of the annular recess 225 to deform as the lens holder 260e is continuously moved downward, such that the flexible ring 2616 will be tightly connected with the annular recess 225, and the rebound force produced by the compressed flexible ring 2616 will exert on the wall of the annular recess 225 to make the lens holder 260e equipped with the flexible ring 2616 be more tightly connected with the interposing plate 22 than a lens holder without the flexible ring 2616. Under the condition that the flexible ring 2616 is tightly connected with the annular recess 225, as the lens holder 260e is moved upwards and downwards, the adverse effect of the backlash between the engaged first and second threads 2610 and 2611 will be minimized due to the function of the flexible ring 2616, thereby reducing the slip of the lens holder 260e during movement of the lens holder 260e. As a result, the position of the lens holder 260e can be precisely controlled when the lens holder 260e is moved upwards and downwards.

Figure 13A:
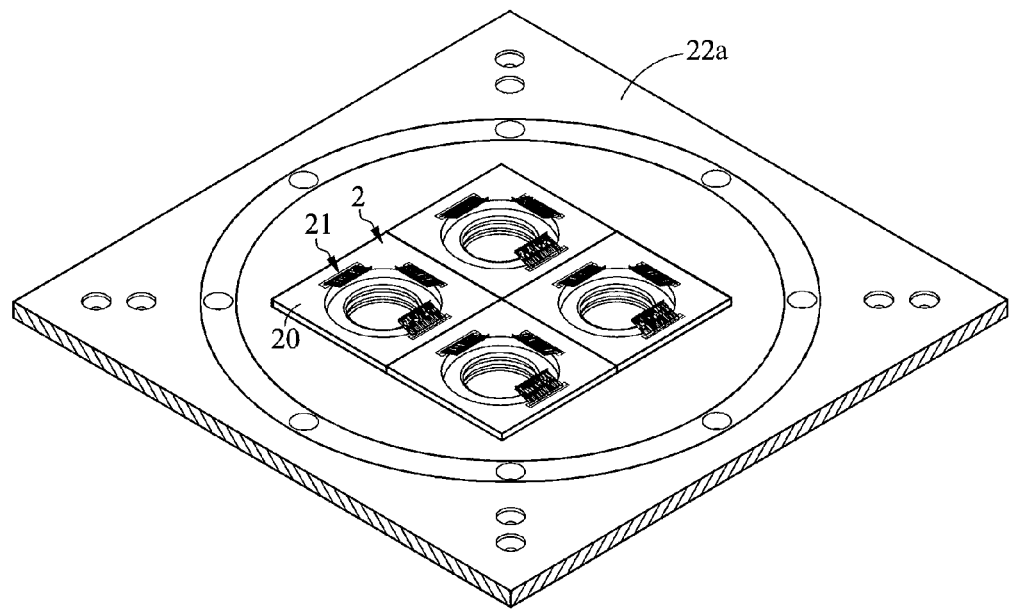
FIGS. 13A and 13B are schematic drawings respectively showing that a plurality of substrates, on each of which a plurality of probe modules are mounted, are arranged in a matrix format.
Figure 13B:
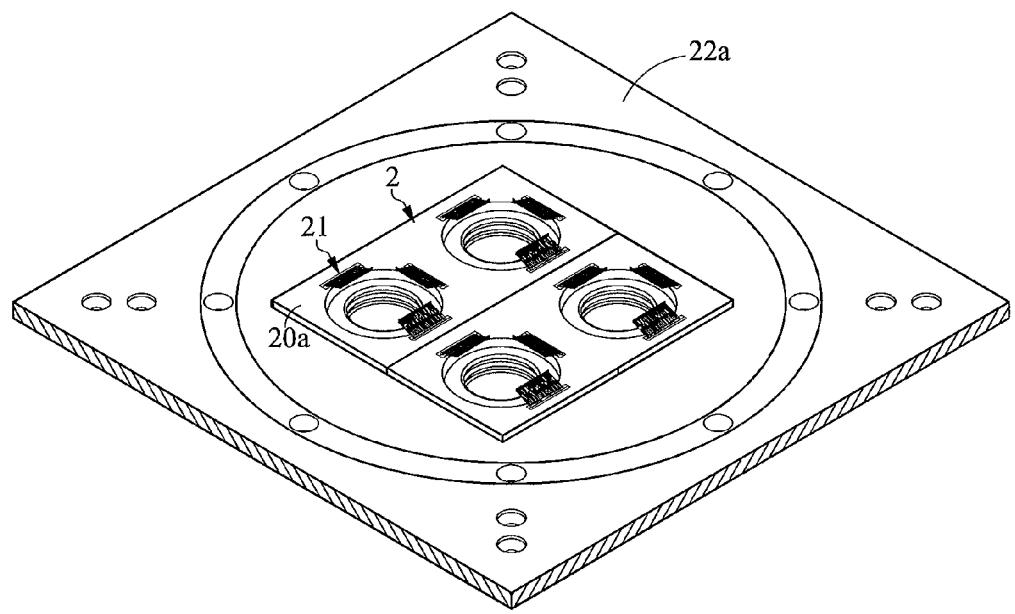

As shown in FIGS. 2A, 2B and 11A to 11C, the interposing plate 22 is in cooperation with one lens adjusting mechanism; however, the present invention is not limited to the disclosures shown in these figures. In still another embodiment, the interposing plate 22 may be configured to be equipped with a plurality of lens adjusting mechanisms based on the actual need and the design spirit of the present invention, as shown in FIG. 13A or FIG. 13B.

In the above-mentioned embodiments, taking the embodiment shown in FIG. 2A for example, a light source passing through the lens 27 built inside the lens adjusting mechanism 26 will produce an optical signal reaching on the device under test (DUT) 90, which is a chip for optical detection. In this embodiment, the DUT 90 may mainly be an image sensing chip, such as CMOS image sensor (CIS). Since the high frequency probe card 2 of the present invention is used to test the electric characteristics of the DUT 90 for optical detection, the high frequency probe card 2 is configured to receive a light source for enabling the DUT 90 to convert the received optical signal into an electric signal, which will be transmitted to the circuit board 23 by the probe module 21, and then transmitted to the tester to determine whether there is any problem of the signal of the DUT 90 upon receiving light. In order to let the lens adjusting mechanism 26 get closer to the DUT 90, the caliber of the second opening 220 is designed to be smaller than that of the first opening 200. In this way, the distance between the lens adjusting mechanism 26 and the DUT 90 can be adjusted as short as possible by engaging the second thread 2611 with the first thread 2610 and turning the lens holder 260 to move towards the DUT 90. In another aspect, in still another embodiment, the second conductor 214 may be simultaneously disposed in the groove 202 and the second groove 222.

Figure 12:
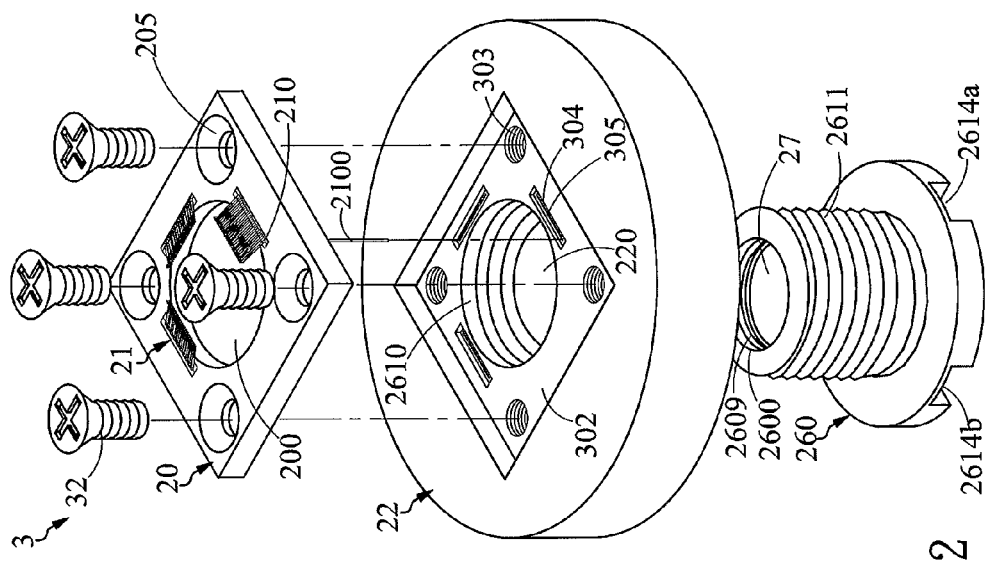
FIG. 12 is an exploded view of an optical inspection device of the present invention.

Referring to FIG. 12, this figure is an exploded view of an optical inspection device further provided by the present invention. The optical inspection device 3 comprises an interposing plate 22, a lens holder 260, a substrate 20 and a plurality of probe modules 21. The interposing plate 22 has a second opening 220, on the wall of which a first thread 2610 is provided. On a surface of the interposing plate 22, a second accommodation 302 is recessedly provided for receiving the substrate 20. The second opening 220 is configured penetrating the body of the interposing plate 22 and communicated with the second accommodation 302 in such a manner that the second opening 220 is in alignment with the first opening 200 of the corresponding substrate 20. On the bottom surface of the second accommodation 302, a plurality of threaded holes 303 are provided. In this embodiment, the threaded holes 303 are located at four corners of the bottom surface of the second accommodation 302 and aimed at the four countersunk holes 205 of the substrate 20, respectively. A plurality of grooves 304 are further provided on the bottom surface of the second accommodation 302 and correspond in location to the probe modules 21, respectively. Each of the grooves 304 has a bottom surface, on which a plurality of through holes 305 penetrating the body of the interposing plate 22 are provided in such a manner that these through holes 305 correspond in location to the series of probes 210 of one of the probe module 21, respectively. In this way, the extension portion 2100 of each probe of the series of probes 210 can pass through the corresponding through hole 305 and then be electrically connected with the contact pad on the surface of the circuit board of the probe card.

The lens holder 260 is screwingly coupled into the second opening 220 and provided with an accommodation 2600, in which a lens 27 is received. The outer wall surface of the lens holder 260 is provided with a second thread 2611 engageable with the first thread 2610. In an embodiment, the lens 27 is screwingly engaged with the thread 2609 provided inside the lens holder 260 through thread. On an end of the lens holder 260, a plurality of adjustment notches 2614a and 2614b are provided for being coupled with an adjustment jig. By means of turning the lens holder 260 by the adjustment jig, the lens holder 260 can be moved upwards and downwards through the engagement of the second thread 2611 with the first thread 2610. The adjustment jig may be, but not limited to, a cross-shaped jig or a linear-shaped jig.

By means of fasteners 32, such as screws, passing through the countersunk holes 205 and engaging into the threaded holes 303 respectively, the substrate 20 is fixedly fastened in the second accommodation 302 of the interposing plate 22. During chip testing, an external light source may be used to project light on the chip under test to make the chip under test produce electric signals. After the series of probes 210 contacting the chip under test receive the electric signals, the signals will be transmitted to the contact pads of the circuit board, which will in turn be transmitted from the circuit board to the tester for further processing. Since the lens holder 260 is screwingly coupled into the second opening 220 and the second opening 220 is aligned with the first opening 200 of the substrate 20, the lens 27 disposed inside the lens holder 260 can receive light through the first opening 200 to make the optical inspection on the device under test possible.

The above-disclosed interposing plate 22 is in cooperation with a single substrate 20; however, the interposing plate 22 can be configured to be mounted with a plurality of substrates as shown in FIGS. 13A and 13B. FIGS. 13 A and 13B are schematic drawings respectively showing that a plurality of substrates, on each of which a plurality of probe modules are mounted, are arranged in a matrix format. In the embodiments shown in FIGS. 13 A and 13B, the substrates 20 and 20a are mounted on the interposing plate 22a in a manner of two-dimensional matrix arrangement. Each substrate 20 may correspond to one or more lens holders. In FIG. 13A, each substrate 20 is mounted with a plurality of probe modules 21 arranged in a single U-shaped manner; however, in FIG. 13B, a plurality of probe modules 21 are arranged on a signal substrate 20a in a plurality of U-shaped manners. These modifications are made based on the design spirit of the present invention.

Although particular embodiments of the invention have been described in detail for purposes of illustration, various modifications and enhancements may be made without departing from the spirit and scope of the invention. Accordingly, the invention is not to be limited except as by the appended claims.

What is claimed is:

1. A high frequency probe card comprising:
at least one substrate each having at least one first opening;
an interposing plate disposed on the at least one substrate and provided with at least one second opening corresponding to the at least one first opening respectively;
a circuit board disposed on the interposing plate and provided with a third opening corresponding to the at least one first opening and the at least one second opening; and
at least one probe module disposed on the at least one substrate and arranged around a periphery of the at least one first opening respectively; the at least one probe module comprising:
at least one ground probe; and
at least one high frequency signal probe penetrating through the corresponding at least one substrate and the interposing plate, passing through the third opening and being electrically connected with the circuit board; each said high frequency signal probe comprising:
a signal probe; and
a first conductor corresponding to the signal probe and being electrically connected with the ground probe; wherein an insulation layer is disposed between the signal probe and the first conductor.

2. The high frequency probe card as claimed in claim 1, further comprising an insulation sleeve; wherein the first conductor is a lead wire and the insulation layer is covered on a surface of the lead wire that corresponds to the signal probe; the insulation sleeve is sleeved onto the signal probe and the lead wire; the lead wire has an end electrically connected with the ground probe, and the other end electrically connected with a grounding contact pad on a top surface of the circuit board; the insulation layer keeps the signal probe away from the first conductor at an insulation distance, which is smaller than an inner diameter of the insulation sleeve and has a minimum value equal to a thickness of the insulation layer.

3. The high frequency probe card as claimed in claim 2, wherein the at least one probe module each comprises a second conductor and a plurality electric contacts, which are provided at locations of the second conductor corresponding to the ground probe and the first conductor respectively; each of the electric contacts is electrically connected with one of the ground probe and the end of the first conductor.

4. The high frequency probe card as claimed in claim 3, wherein the second conductor has a first surface and a second surface opposite to the first surface; the electric contacts are provided at the first surface each said signal probe is abutted on the second surface through an insulation member; each said signal probe includes:
an extension portion sleeved into the insulation sleeve, penetrating the corresponding substrate and the interposing plate, passing through the third opening and being electrically connected with the circuit board;
a suspension arm connected with the extension portion and defining with the extension portion a first contained angle; and
a detecting portion connected with the suspension arm and defining with the suspension arm a second contained angle.

5. The high frequency probe card as claimed in claim 1, further comprising a second conductor; wherein the insulation layer is an insulation sleeve sleeved onto the signal probe, and the first conductor is a metal film formed on a circumference surface of the insulation sleeve; a plurality electric contacts are provided at locations of the second conductor corresponding to the ground probe and the metal film respectively; each of the electric contacts is electrically connected with one of the ground probe and an end of the metal film; the metal film has the other end electrically connected with a grounding contact pad on a top surface of the circuit board.

6. The high frequency probe card as claimed in claim 3, wherein each said substrate includes at least one groove corresponding in location to the at least one probe module; the second conductor is disposed in the groove corresponding to the probe module; the high frequency signal probe of each said probe module penetrates through the corresponding substrate through the corresponding groove.

7. The high frequency probe card as claimed in claim 4, wherein each said substrate includes at least one groove corresponding in location to the at least one probe module; the second conductor is disposed in the groove corresponding to the probe module; the high frequency signal probe of each said probe module penetrates through the corresponding substrate through the corresponding groove.

8. The high frequency probe card as claimed in claim 5, wherein each said substrate includes at least one groove corresponding in location to the at least one probe module; the second conductor is disposed in the groove corresponding to the probe module; the high frequency signal probe of each said probe module penetrates through the corresponding substrate through the corresponding groove.

9. The high frequency probe card as claimed in claim 3, wherein the interposing plate includes at least one second groove corresponding in location to the at least one probe module; the second conductor is disposed in the second groove corresponding to the probe module.

10. The high frequency probe card as claimed in claim 4, wherein the interposing plate includes at least one second groove corresponding in location to the at least one probe module; the second conductor is disposed in the second groove corresponding to the probe module.

11. The high frequency probe card as claimed in claim 5, wherein the interposing plate includes at least one second groove corresponding in location to the at least one probe module; the second conductor is disposed in the second groove corresponding to the probe module.

12. The high frequency probe card as claimed in claim 1, wherein the ground probe penetrates the corresponding substrate and the interposing plate, passes through the third opening, and is electrically connected with the circuit board.

13. The high frequency probe card as claimed in claim 1, wherein the first conductor penetrates the interposing plate, passes through the third opening, and is electrically connected with the circuit board.

14. The high frequency probe card as claimed in claim 1, wherein the at least one second opening has a caliber smaller than that of the at least one first opening; the high frequency probe card further comprises at least one lens adjusting mechanism comprising:

a lens holder coupled in the at least one second opening and provided with an accommodation;

a position adjusting structure configured corresponding to the at least one second opening and the lens holder and formed with the interposing plate and the lens holder for enabling the lens holder to do a position adjusting motion in the at least one second opening.

15. The high frequency probe card as claimed in claim 14, wherein the lens holder has at least one adjustment notch provided at a top surface of the lens holder at a periphery of an opening of the accommodation of the lens holder; wherein each said position adjusting structure comprises:

a first thread formed on a wall surface of the interposing plate defining the second opening; and a second thread formed on an outer wall surface of the lens holder for engaging with the first thread.

16. The high frequency probe card as claimed in claim 15, wherein the position adjusting structure further comprises a flexible ring sleeved onto the lens holder; the interposing plate is provided with an annular recess surrounding around and communicating with the second opening; wherein an outer diameter of the flexible ring is greater than or equal to a caliber of the annular recess, such that the flexible ring is compressed by and tightly connected with a wall of the annular recess when the lens holder is screwingly engaged with the interposing plate.

17. The high frequency probe card as claimed in claim 1, wherein the circuit board is provided at a top surface thereof with a plurality of high frequency signal contact pads and a plurality of grounding contact pads; wherein each said high frequency signal contact pad is electrically connected with an end of one said signal probes, and each said grounding contact pad is electrically connected with an end of one said first conductor.

18. The high frequency probe card as claimed in claim 1, wherein each said substrate comprises grooves each for accommodating one said probe module; each said probe module comprises a fixing member connected with a corresponding said groove; the at least one ground probe and the at least one high frequency signal probe are connected with the fixing member and penetrate through the corresponding substrate through the corresponding groove; wherein the grooves penetrate through a body of the substrate and one said fixing member is received in one said groove.

19. The high frequency probe card as claimed in claim 18, wherein the grooves of the substrate are communicated together, and the fixing members of the probe modules are connected together to form a one-piece fixing structure.

20. The high frequency probe card as claimed in claim 19, wherein the one-piece fixing structure has a rectangle-shaped or U-shaped configuration.

\* \* \* \* \*